United States Patent
Nagasaka

(10) Patent No.: US 8,345,217 B2
(45) Date of Patent: Jan. 1, 2013

(54) LIQUID RECOVERY MEMBER, EXPOSURE APPARATUS, EXPOSING METHOD, AND DEVICE FABRICATING METHOD

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 576 days.

(21) Appl. No.: 12/149,782

(22) Filed: May 8, 2008

(65) Prior Publication Data

US 2008/0231824 A1    Sep. 25, 2008

Related U.S. Application Data

(63) Continuation of application No. PCT/JP2006/322636, filed on Nov. 14, 2006.

(30) Foreign Application Priority Data

Nov. 14, 2005    (JP) ................................ P2005-328549

(51) Int. Cl.
  *G03B 27/52*    (2006.01)
(52) U.S. Cl. ........................................... 355/30; 355/53
(58) Field of Classification Search ................ 355/30, 355/53
  See application file for complete search history.

(56) References Cited

U.S. PATENT DOCUMENTS

| | | | |
|---|---|---|---|
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,721,034 B1 | 4/2004 | Horikawa | |
| 6,778,257 B2 | 8/2004 | Bleeker et al. | |
| 6,897,963 B1 | 5/2005 | Taniguchi et al. | |
| 6,952,253 B2 | 10/2005 | Lof et al. | |
| 7,053,983 B2 | 5/2006 | Tokita | |
| 7,251,017 B2 | 7/2007 | Novak et al. | |
| 7,292,313 B2 | 11/2007 | Poon et al. | |
| 2004/0263809 A1* | 12/2004 | Nakano | 355/30 |
| 2005/0073670 A1* | 4/2005 | Carroll | 355/77 |
| 2005/0233081 A1 | 10/2005 | Tokita | |
| 2005/0259234 A1 | 11/2005 | Hirukawa et al. | |
| 2006/0023188 A1 | 2/2006 | Hara | |
| 2006/0038968 A1 | 2/2006 | Kemper et al. | |
| 2006/0098177 A1 | 5/2006 | Nagasaka | |
| 2006/0119818 A1 | 6/2006 | Nagasaka | |
| 2006/0221315 A1* | 10/2006 | Beckers et al. | 355/30 |
| 2006/0250593 A1* | 11/2006 | Nishii | 355/53 |

(Continued)

FOREIGN PATENT DOCUMENTS

EP    1 571 697 A1    9/2005

(Continued)

OTHER PUBLICATIONS

Office Action issued in Singapore Patent Application No. 200803592-5, on Jun. 8, 2010.

(Continued)

*Primary Examiner* — Peter B Kim
*Assistant Examiner* — Mesfin T Asfaw
(74) *Attorney, Agent, or Firm* — Oliff & Berridge, PLC

(57) ABSTRACT

An exposure apparatus comprises a recovery member that recovers a liquid. The recovery ability with which the recovery member recovers the liquid differs in accordance with the region of the recovery member.

45 Claims, 21 Drawing Sheets

U.S. PATENT DOCUMENTS

| | | |
|---|---|---|
| 2006/0291060 A1 | 12/2006 | Shirai et al. |
| 2007/0146663 A1 | 6/2007 | Nagasaka |
| 2008/0018866 A1 | 1/2008 | Nagasaka et al. |
| 2008/0068567 A1 | 3/2008 | Nagasaka et al. |

FOREIGN PATENT DOCUMENTS

| | | |
|---|---|---|
| EP | 1632991 A1 | 3/2006 |
| EP | 1 710 630 A2 | 10/2006 |
| EP | 1768170 A1 | 3/2007 |
| JP | A-08-130179 | 5/1996 |
| JP | A-10-163099 | 6/1998 |
| JP | A-10-214783 | 8/1998 |
| JP | A-11-135400 | 5/1999 |
| JP | A-2000-505958 | 5/2000 |
| JP | A-2000-164504 | 6/2000 |
| JP | A-2004-519850 | 7/2004 |
| JP | A-2005-012195 | 1/2005 |
| JP | A-2005-45232 | 2/2005 |
| JP | A-2005-85789 | 3/2005 |
| JP | A-2005-191344 | 7/2005 |
| WO | WO 98/28665 | 7/1998 |
| WO | WO 99/49504 | 9/1999 |
| WO | WO 01/35168 A1 | 5/2001 |
| WO | WO 02/069049 A2 | 9/2002 |
| WO | WO 2004/019128 A2 | 3/2004 |
| WO | WO 2004/053955 A1 | 6/2004 |
| WO | WO 2004/090956 A1 | 10/2004 |
| WO | WO 2004/092833 A2 | 10/2004 |
| WO | WO 2004/105106 A1 | 12/2004 |
| WO | WO 2005/020298 A1 | 3/2005 |
| WO | WO 2005/024517 A2 | 3/2005 |
| WO | WO 2005/059617 A2 | 6/2005 |
| WO | WO 2005/059618 A2 | 6/2005 |
| WO | WO 2005/067013 A1 | 7/2005 |
| WO | WO 2005/104195 | 11/2005 |
| WO | WO 2005/122220 A1 | 12/2005 |
| WO | WO 2005/122221 A1 | 12/2005 |

OTHER PUBLICATIONS

Search Report issued in European Patent Application No. 06832598.4, dated Apr. 15, 2010.

International Search Report issued in International Application No. PCT/JP2006/322636, dated Dec. 26, 2006 (with translation).

Written Opinion issued in International Application No. PCT/JP2006/322636, dated Dec. 26, 2006 (with translation).

Written Opinion issued in Australian Patent Application No. SG 200803592-5, dated Jun. 2, 2009.

Search Report issued in European Patent Application No. 06832598.4, dated Apr. 23, 2010.

Written Opinion issued in Singapore Patent Application No. SG 200803592-5, dated Sep. 14, 2009.

European Office Action dated Dec. 16, 2010 for European Application No. EP 06832598.4.

Nov. 22, 2011 Office action issued in Japanese Patent Application No. 2007-544233 (with translation).

Jul. 24, 2012 Office Action issued in Japanese Patent Application No. 2007-544233 (with English-language translation).

* cited by examiner

US 8,345,217 B2

LIQUID RECOVERY MEMBER, EXPOSURE APPARATUS, EXPOSING METHOD, AND DEVICE FABRICATING METHOD

CROSS-REFERENCE TO RELATED APPLICATION

This is a Continuation Application of International Application No. PCT/JP2006/322636, fled Nov. 14, 2006, which claims priority to Japanese Patent Application No. 2005-328549, filed Nov. 14, 2005. The contents of the aforementioned applications are incorporated herein by reference.

FIELD OF THE INVENTION

The present invention relates to: a liquid recovery member that is used in an immersion exposure apparatus; an exposure apparatus and an exposing method that expose a substrate, and a device fabricating method.

DESCRIPTION OF RELATED ART

With exposure apparatuses that are used in photolithography, a liquid immersion type exposure apparatus has been proposed that fills an optical path space of exposure light with a liquid and exposes a substrate through that liquid, as disclosed in PCT International Publication WO99/49504.

With exposure apparatuses, there is a demand to increase the movement speed of substrates in order to increase device productivity and the like. Incidentally, if the substrate is moved at a high speed in a state wherein the optical path space of the exposure light is filled with the liquid, then there is a possibility that problems will arise such as the liquid leaking or remaining on the substrate. If these problems occur, then there is a possibility that exposure accuracy and measurement accurancy will deteriorate, which will result in the degradation of the performance of the manufactured device.

A purpose of some aspects of the present invention is to provide a liquid recovery member that can satisfactorily recover a liquid, an exposure apparatus, an exposing method, and a device fabricating method.

Another purpose is to provide: an exposure apparatus and an exposing method that can satisfactorily expose a substrate in a state wherein an optical path space of exposure light is filled with a liquid, even when performing an exposure while moving the substrate, and a device fabricating method that uses the exposure apparatus.

SUMMARY

A first aspect of the invention provides an exposure apparatus that exposes a substrate by radiating exposure light on the substrate and comprises: a recovery member that recovers a liquid; wherein, the recovery member includes a first portion, which has a first liquid recovery ability, and a second portion, which has a second liquid recovery ability that is different than the first liquid recovery ability.

According to the first aspect of the invention, the substrate can be exposed satisfactorily in the state wherein the optical path space of the exposure light is filled with the liquid, even when the exposure is performed while moving the substrate.

A second aspect of the invention provides a device fabricating method wherein an exposure apparatus according to the abovementioned aspect is use.

According to the second aspect of the invention, a device can be manufactured using the exposure apparatus that can expose the substrate satisfactorily in the state wherein the optical path space of the exposure light is filled with the liquid.

A third aspect of the invention provides an exposing method that exposes a substrate by radiating exposure light on the substrate and comprises: moving the substrate to a position at which it opposes the liquid recovery member, recovering a liquid on the substrate via a first portion of the liquid recovery member with a first recovery ability; recovering the liquid on the substrate via a second portion, which is disposed at a position that if different from the first portion of the liquid recovery member, with a second recovery ability, which is different than the first recovery ability; and radiating the exposure light to the she through the liquid on the substrate.

According to the third aspect of the invention, the liquid on the substrate can be recovered satisfactorily while the optical path space of the exposure light is filled with the liquid, even when the exposure is performed while moving the substrate.

A fourth aspect of the invention provides a device fabricating method wherein an exposing method according to the abovementioned aspects of the invention is used.

According to the fourth aspect of the invention, the liquid on the substrate can be recovered satisfactorily while the optical path space of the exposure light is filled with the liquid, and thereby a device that has a desired performance can be manufactured.

A fifth aspect of the invention provides a liquid recovery member that is used to recover a liquid in an immersion exposure apparatus and comprises: a first portion that has a first liquid recovery ability; and a second portion, which has a second liquid recovery ability that is different from the first liquid recovery ability, that is disposed at a position that is different than the first portion.

According to the fifth aspect of the invention, in the immersion exposure apparatus, the liquid can be recovered satisfactorily while the optical path space of the exposure light is filled with the liquid, even when the exposure is performed while moving the substrate.

According to the some aspects of the present invention, it is possible to expose a substrate satisfactorily in a state wherein an optical path space of exposure light is filled with a liquid, and to fabricate a device that has a desired performance.

DESCRIPTION OF EMBODIMENT

The following explains the embodiments of the present invention referencing the drawings, but the present invention is not limited veto.

First Embodiment

Figure 1:
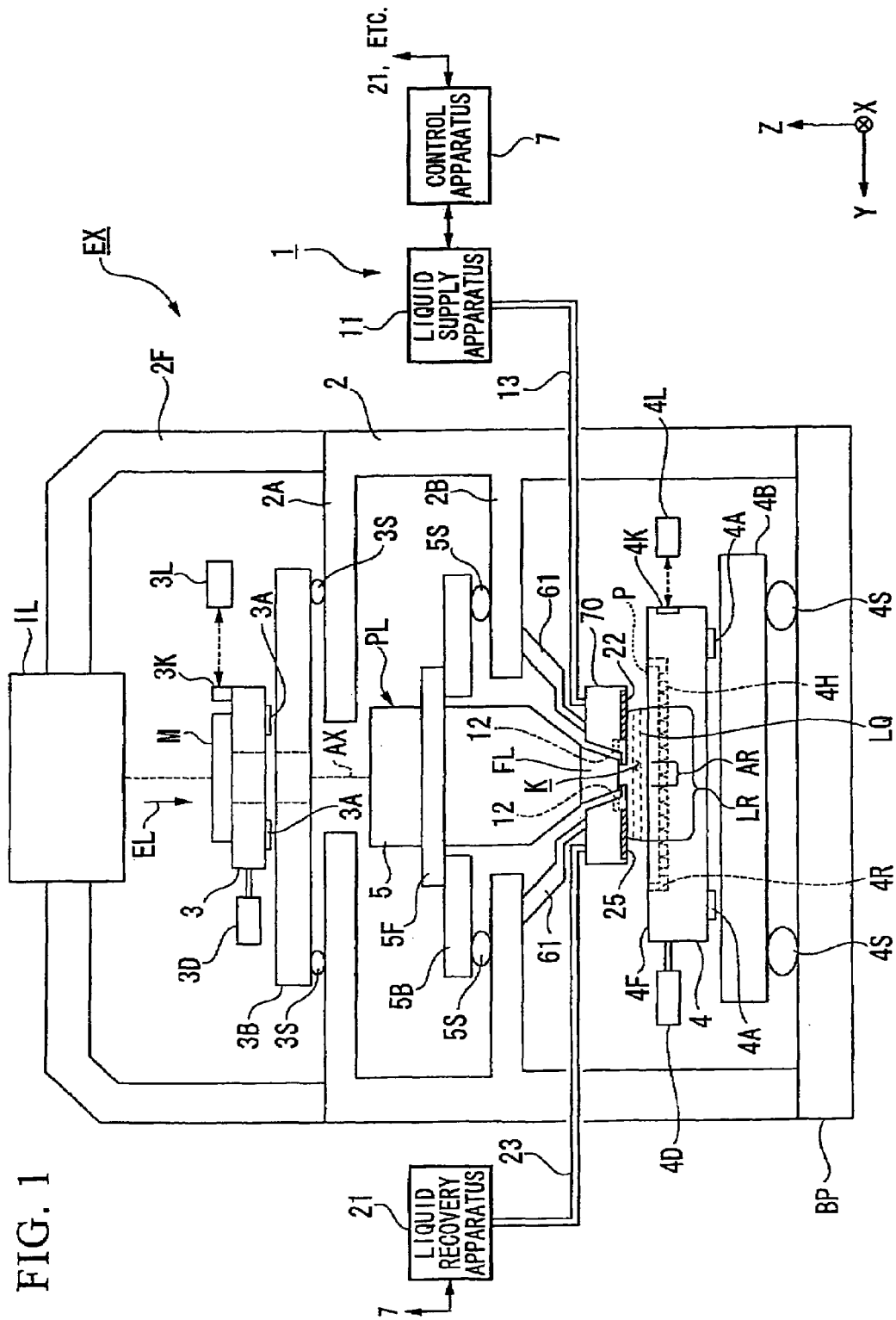
FIG. 1 is a schematic block diagram that shows an exposure apparatus according to a first embodiment.

FIG. 1 is a schematic block diagram that shows an exposure apparatus according to a first embodiment. In FIG. 1, an exposure apparatus EX comprises a movable mask stage 3 that holds a mask M; a movable substrate stage 4 that holds a substrate P; an illumination system IL; which illuminates the mask M supported by the mask stage 3 with exposure light EL, a projection optical system PL, which projects an image of a pattern of the mask M that is illuminated by the exposure light EL onto the substrate P that is held by the substrate stage 4; and a control apparatus 7, which controls the operation of the entire exposure apparatus EX.

Furthermore, the substrate P described herein includes one wherein a photosensitive material (photoresist) and a film, for example a protective film are coated on a base material such as a semiconductor wafer. The mask M includes a reticle wherein a device pattern is formed that is reduction projected onto the substrate P. In addition, a transmitting type mask is used as the mask M in the present embodiment, but a reflection type mask may also be used.

The present embodiment explains an exemplary case wherein a scanning type exposure apparatus (a so-called scanning stepper) is used as the exposure apparatus EX that exposes the substrate P with the pattern formed on the mask M, while synchronously moving the ma M and the substrate P in the scanning directions. In the following explanation, the directions in which the mask M and the substrate P synchronously move (the scanning directions) within the horizontal plane are the Y axial directions, the directions that are orthogonal to the Y axial directions within the horizon plane are the X axial directions (the non-scanning directions), and the directions that are perpendicular to the X and Y axial directions and parallel to an optical axis AX of the projection optical system PL are the Z a directions. In addition, the rotational (the inclined) directions around the X, Y, and Z axes are the θX, θY, and θZ directions, respectively.

The exposure apparatus EX of the present embodiment is a liquid immersion type exposure apparatus that employs a liquid immersion method and comprises an immersion system 1 that fills an optical path space K of the exposure light EL on the image plane side of the projection optical system PL with a liquid LQ. The immersion system 1 forms an immersion area LR of the liquid LQ on the substrate P so that the optical path space K of the exposure light EL between a last optical element FL of the projection optical system PL and the substrate P, which is held by the substrate stage 4, is filled with the liquid LQ. Here, the last optical element FL is the optical element of a plurality of optical elements of the projection optical system PL that is closest to the image plane of the projection optical system PL.

The immersion system 1 comprises: a nozzle member 70 that is provided in the vicinity of the optical path space K of the exposure light EL on the image plane side of the projection optical system PL and that has supply ports 12, which are capable of supplying the liquid LQ to the optical path space K, and a recovery port 22, which is capable of recovering the liquid LQ; a liquid supply apparatus 11 that supplies the liquid LQ to the optical path space K through supply pipes 13 and the supply ports 12 of the nozzle member 70; and a liquid recovery apparatus 21 that recovers the liquid LQ through the recovery port 22 of the nozzle member 70 and recovery pipes 23.

As discussed below, in the immersion system 1 of the present embodiment is configured so that the liquid LQ recovery ability varies with the region of the nozzle member 70. In the present embodiment, a porous member 25 is disposed in the recovery port 22, and the liquid LQ recovery ability differs with each region of the porous member 25.

The control apparatus 7 controls the operation of the liquid supply apparatus 11 and the liquid recovery apparatus 21. The liquid supply apparatus 11 comprises, for example, a temperature adjusting apparatus, which adjusts the temperature of the liquid LQ to be supplied, and a filter apparatus, which eliminates foreign matter and the like from the liquid LQ to be supplied, and is capable of feeding the liquid LQ, which is pure and temperature adjusted. The liquid recovery apparatus 21 comprises a suction apparatus, such as a vacuum system, that is capable of suctioning a fluid that includes the liquid LQ and a gas, and therefore is capable of recovering the liquid LQ. To expose the substrate P, the exposure apparatus EX projects an image of the pattern of the mask M thereon by radiating the exposure light EL, which passes through the task M, onto the substrate P through the projection optical system PL and the liquid LQ that fills the optical path space K. In addition, the exposure apparatus E of the present embodiment employs a local liquid-immersion system that fills the optical path space K with the liquid LQ and locally forms the immersion area LR, which is larger than a projection area AR of the projection optical system PL and smaller than the substrate P, of the liquid LQ in some area of the subsume P that includes the projection area AR.

The exposure apparatus EX comprises a base BP, which is provided on a floor, and a main fine 2, which is installed on the base BP. The illumination system IL is supported by a subframe 2F, which is fixed to an upper part of the main frame 2. The illumination system IL illuminates a prescribed illumination area on the mask M with the exposure light EL, which has a uniform luminous flux intensity distribution. Examples of light that can be used as the exposure light EL emitted from the illumination system IL include: dew ultraviolet light (DUV light) such as bright line (g-line, h-line, or i-line) light emitted from, for example, a may lamp and KrF excimer laser light (248 m wavelength); and vacuum ultraviolet light (DUV light) such as ArF excimer laser light (193 nm wavelength) and $F_2$ laser light (157 nm wavelength). ArF excimer laser light is used in the present embodiment.

In the present embodiment, w (pure water) is used as the liquid LQ. Pure water is capable of transmitting not only ArF excimer laser light, but also deep ultraviolet light (DUV light), e.g., bright line (g-line, h-line, or i-line) light emitted from, for example, a mercury lamp and KrF excimer laser light (248 nm wavelength). In addition, pure water is advantageous because it can be obtained easily in large quantities at, for example, a semiconductor fabrication plant and does not adversely affect, for example, the substrate P and the optical elements.

A mask stage drive apparatus 3D, which comprises actuators such as linear motors, can move the mask stage 3, in a state wherein it holds the mask M, on a mask stage base plate 3B in the X axial, Y axial, and $\theta Z$ directions. The mask stage 3 is noncontactually supported by air bearing 3A with respect to an upper surface (a guide surface) of the mask stage base plate 3B. The mask stage base plate 3B is supported by an upper side support member 2A, which projects toward the inner side of the main frame 2, via vibration isolating apparatuses 3S. Laser interferometers 3L measure the positional information of the mask stage 3 (and in turn, the mask M). The laser interferometers 3L use reflecting mirrors 3K, which are provided on the mask stage 3, to measure the positional information of the mask stage 3. The control apparatus 7 controls the mask stage drive apparatus 3D based on the measurement results of the laser interferometers 3L so as to control the position of the mask M, which is held by the mask stage 3.

Furthermore, the reflecting mirrors 3K need not simply be plane mirrors, but may include corner cubes (retroreflectors); furthermore, it is acceptable to use, for example, reflecting surfaces are formed by mirror polishing end surfaces (side surfaces) of the mask stage 3 instead of providing the reflecting mirrors 3K so that they are fixed to the mask stage 3. In addition, the mask stage 3 may be configured so that it is coarsely and finely movable, as disclosed in, for example, Japanese Patent Application Publication No. H8-130179A (corresponding U.S. Pat. No. 6,721,034).

The projection optical system PL projects an image of the pattern of the mask M onto the substrate P at a prescribed projection magnification and comprises the plurality of optical elements, which are held by a lens barrel 5. The lens barrel 5 comprises a flange 5F, and the projection optical system PL is supported by a lens barrel base plate (main column) 5B via the flange 5F. The main column 5B is supported via a lower side support member 2B, which projects toward the inner side of the main frame 2, via vibration isolating apparatuses 5S. The projection optical system PL of the present embodiment is a reduction system, the projection magnification of which is, for example, ¼, ⅕, or ⅛, and forms a reduced image of the pattern of the mask M in the projection area AR, which is optically conjugate with the illumination area discussed above. Furthermore, the projection optical system PL may be a reduction system, a unity magnification system, or an enlargement system. In addition, the projection optical system PL may be: a dioptric system that does not include catoptric elements; a catoptric system that does not include dioptric elements; or a catadioptric system that includes both catoptric elements and dioptric elements. In addition, the projection optical system PL may form either an inverted image or an erect image.

A substrate stage drive apparatus 4D, which comprises actuators such as linear motors, can move the substrate stage 4, which comprises a substrate holder 4H that holds the substrate P, on a subsume stage base plate 4B with six degrees of freedom, i.e., in the X axial, Y axial Z axial, $\theta X$, $\theta Y$, and $\theta Z$ directions, in a state wherein the substrate holder 4H holds the subs P. The substrate stage 4 is noncontactually supported by air bearings 4A with respect to an upper surface (a guide surface) of the substrate stage base plate 4B. The substrate stage base plate 4B is supported by the base BP via vibration isolating apparatuses 4S. Laser interferometers 4L measure the positional information of the substrate stage 4 (and in turn, the substrate P). The laser interferometers 4L use reflecting mirrors 4K, which are provided to the substrate stage 4, to measure the positional information of the substrate stage 4 in the X axial, Y axial and $\theta Z$ directions. In addition, a focus and level detection system (not shown) detects the surface position information (positional information in the Z axial $\theta X$ and $\theta Y$ directions) of a front surface of the substrate P, which is held by the substrate stage 4. The control apparatus 7 controls the substrate stage drive apparatus 4D based on the measurement results of the laser interferometers 4L and the detection results of the focus and level detection system so as to control the position of the substrate P, which is held by the substrate stage 4.

The focus and level detection system detects inclination information (the rotational angle) of the substrate P in the $\theta X$ and the $\theta Y$ directions by measuring the positional information of the substrate P in the Z axial directions at a plurality of measurement points. Furthermore, if, for example, the laser interferometers 4L are capable of measuring the positional information of the substrate P in the Z axial, the $\theta X$, and the $\theta Y$ directions, then the focus and level detection system does not need to be provided so that the positional information of the substrate P can be measured in the Z axial directions during the exposure operation, and the position of the substrate P in the Z arial, the $\theta X$, and the $\theta Y$ directions may be controlled using the measurement results of the laser interferometers 4L at least during the exposure operation.

Furthermore, in the present embodiment, the substrate holder 4H is disposed in a recessed part 4R, which is provided on the substrate stage 4, and an upper surface 4F that is provided around the recessed part 4R of the substrate stage 4 is a flat surface, the height of which is substantially the same as (flush with) the front surface of the substrate P that is held by the substrate holder 4H. Furthermore, there may be a level difference between the front surface of the substrate P, which is held by the subsume holder 4x and the upper surface 4F of the substrate stage 4. Furthermore, part of the upper surface 4F of the substrate stage 4, e.g., just a prescribed area that surrounds the substrate P, may be at substantially the same height as the front surface of the substrate P. In addition, in the present embodiment, the substrate holder 4H and the substrate stage 4 are configured separately, and the substrate holder 4H is fixed to the recessed part 4R of the substrate stage 4 by, for example, vacuum chucking; however, the substrate holder 4H may be formed integrally with the substrate stage 4.

Figure 2:
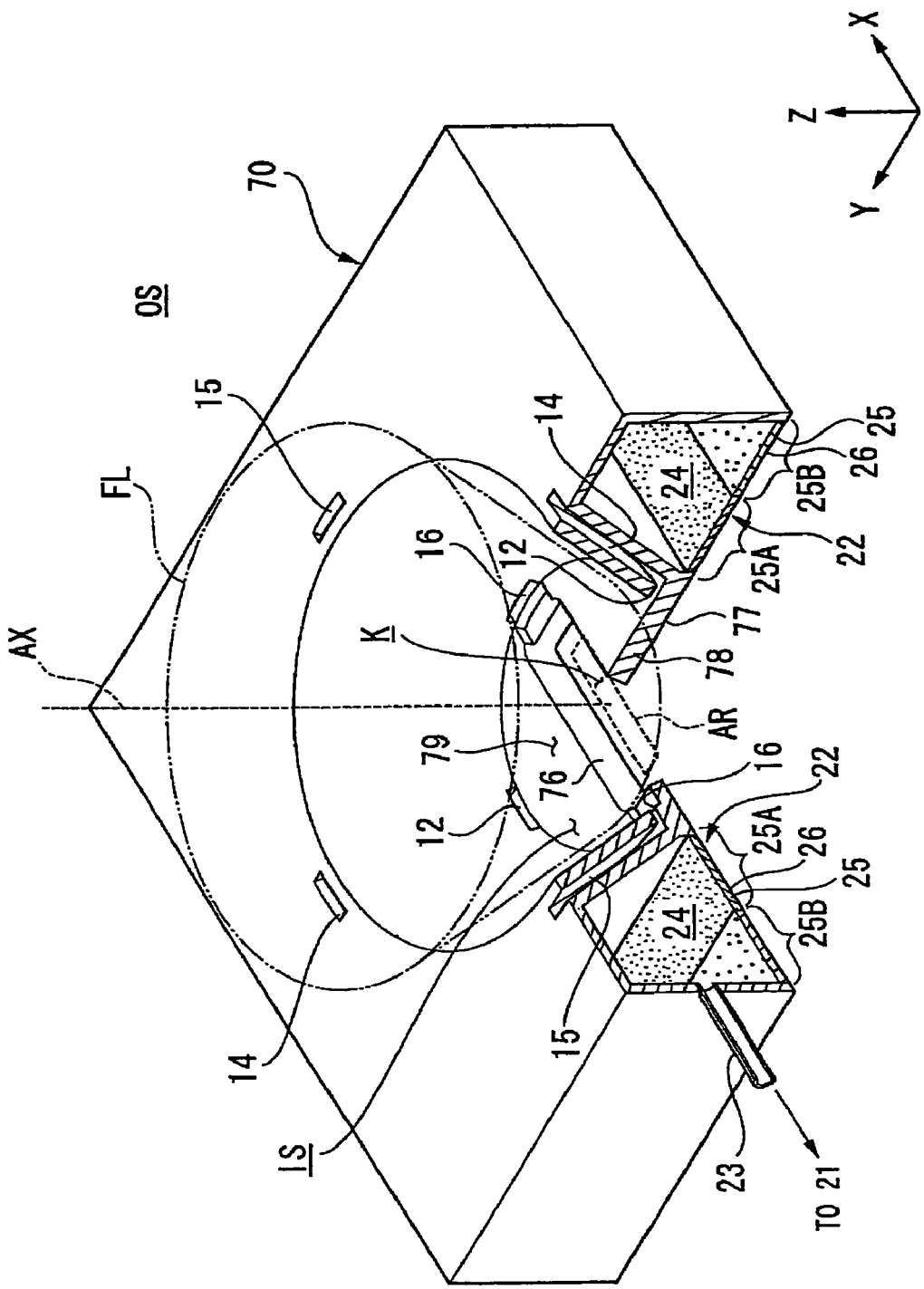
FIG. 2 is a partial, broken, schematic, oblique view that shows the vicinity of a nozzle member according to the first embodiment.
Figure 3:
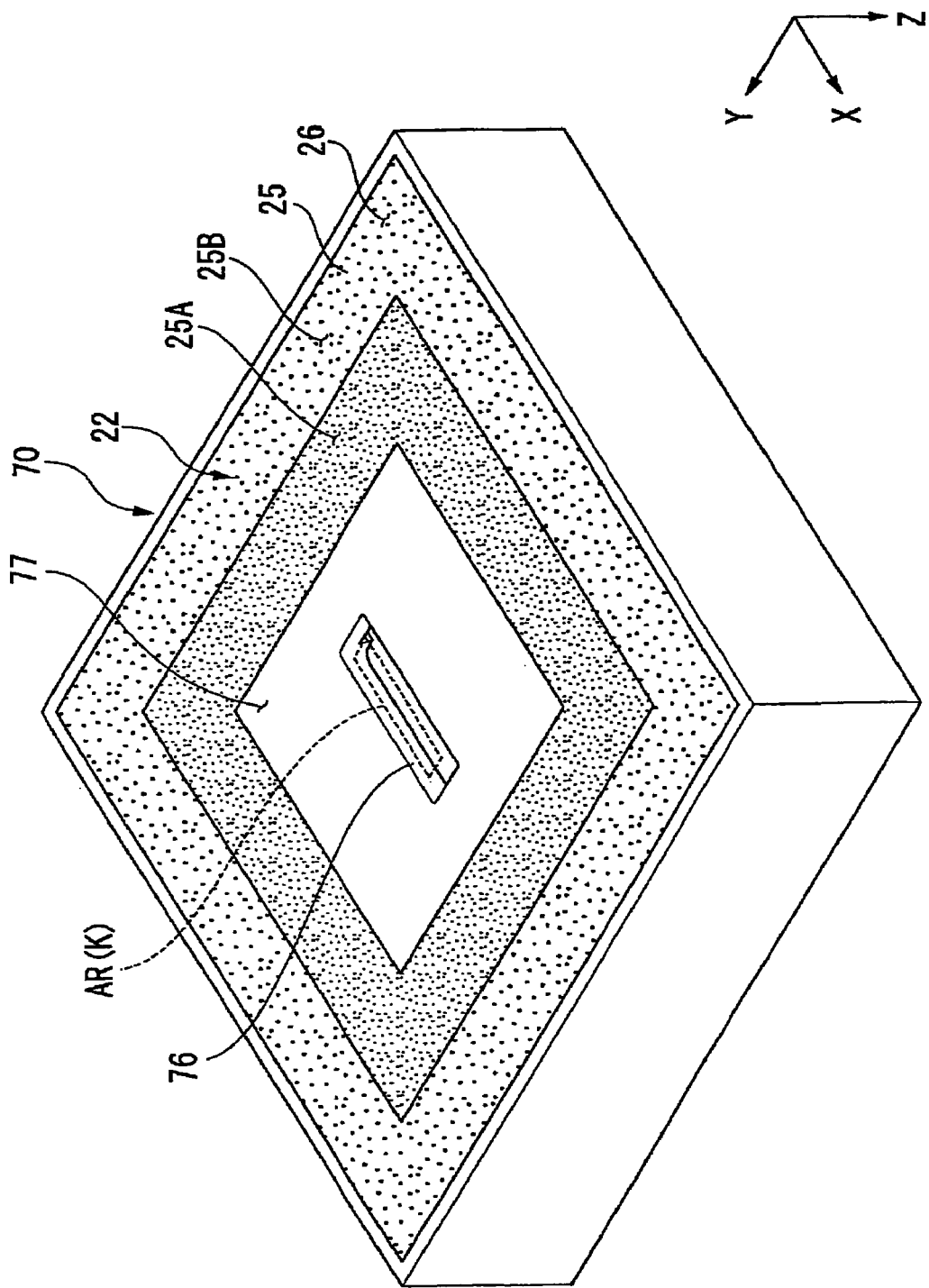
FIG. 3 is an oblique view of the nozzle member according to the first embodiment, viewed from the lower side.
Figure 4:
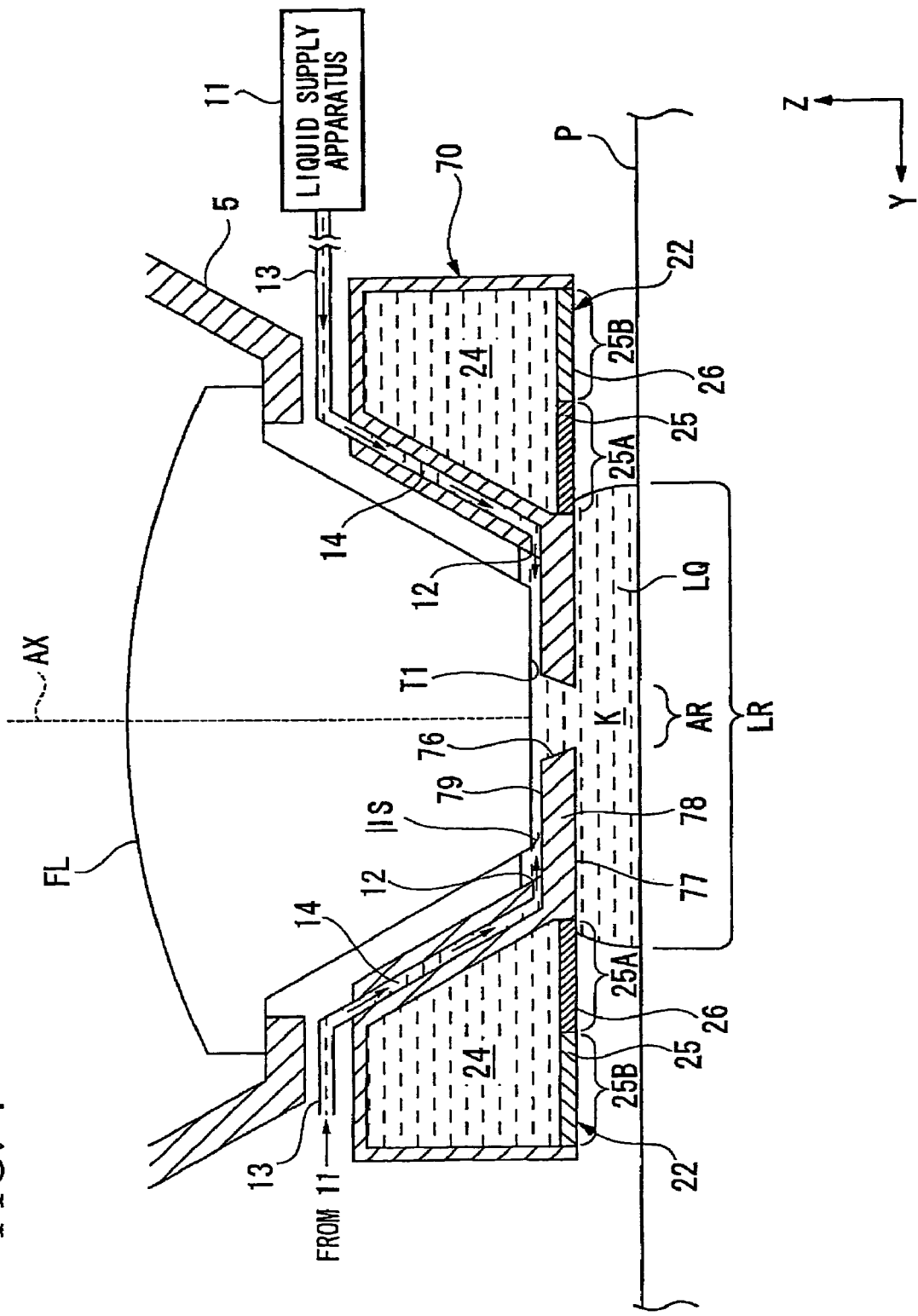
FIG. 4 is a side cross sectional view, parallel to the YZ plane, of the nozzle member according to the first embodiment.
Figure 5:
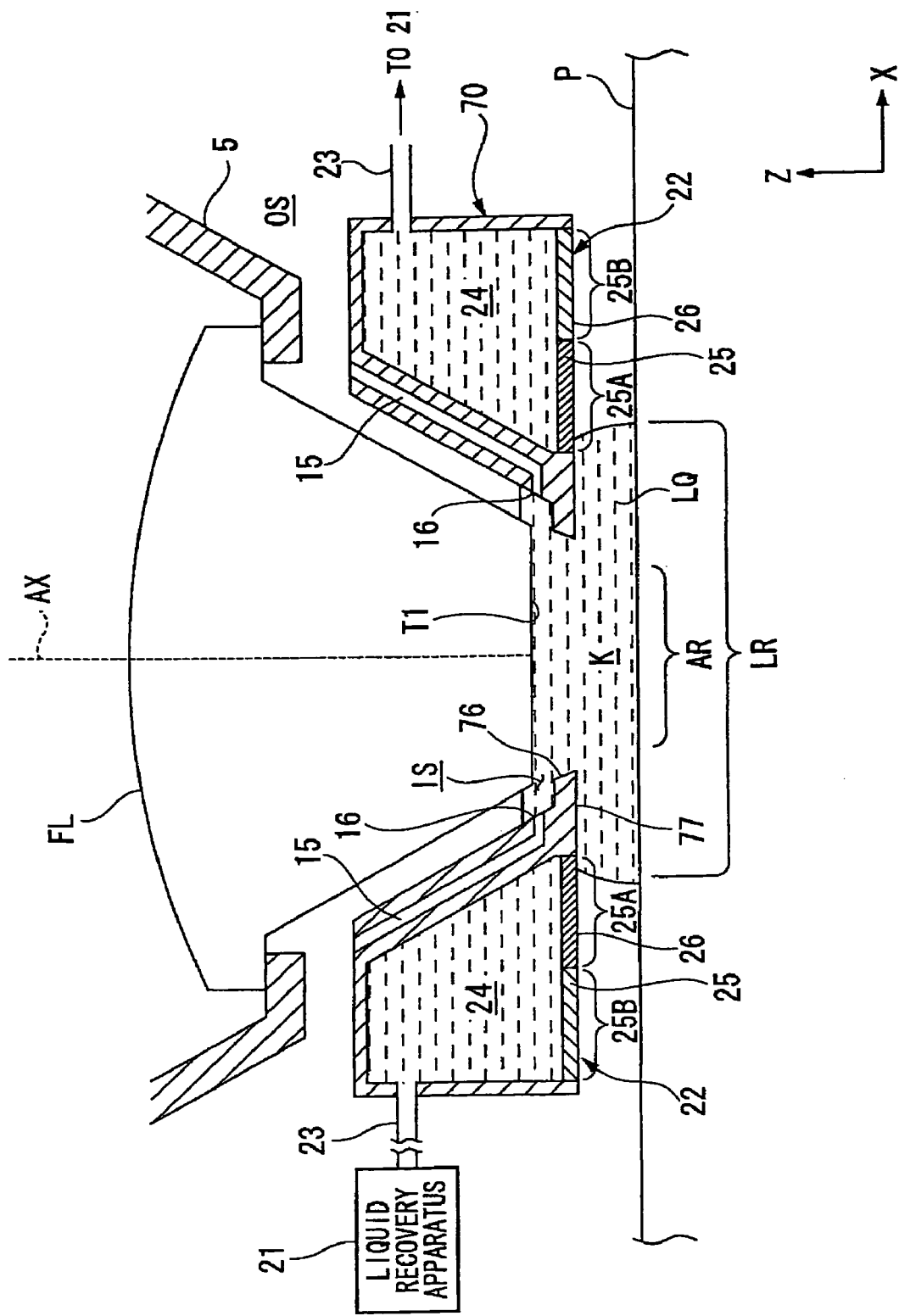
FIG. 5 is a side cross sectional view, parallel to the XZ plane, of the nozzle member according to the first embodiment.

The following explains the nozzle member 70 of the immersion system 1, referencing FIG. 2 through FIG. 5. FIG. 2 is a partial broken, schematic, oblique view that shows the vicinity of the nozzle member 70; FIG. 3 is an oblique view of the nozzle member 70, viewed from the lower side; FIG. 4 is a side cross sectional view that is parallel to the YZ plane; and FIG. 5 is a side cross sectional view that is parallel to the XZ plane.

The nozzle member 70 comprises the supply ports 12, which supply the liquid LQ to the optical path space K, and the recovery port 22, which recovers the liquid LQ. The nozzle member 70 is an annular member and is provided so that it surrounds the last optical element FL. The substrate P (the substrate stage 4) is capable of moving below the nozzle member 70. As shown in FIG. 1, in the present embodiment, the nozzle member 70 is supported by the lower side support member 2B of the main frame 2 via a support apparatus 61, and is spaced apart from the last optical element FL. In addition, the nozzle member 70 comprises a bottom plate 78, which has an upper surface 79 that opposes a lower surface T1 of the last optical element FL. When the substrate P (the substrate stage 4) is disposed below the nozzle member 70, part of the bottom plate 78 is disposed between the lower surface T1 of the last optical element FL and the substrate P (the substrate stage 4) in the Z axial directions. In addition, a space that comprises a prescribed gap is provided between the lower surface T1 of the last optical element FL and the upper surface 79 of the bottom plate 78. In the explanation below, a space on the inner side of the nozzle member 70 that includes the space between the lower surface T1 of the last optical element FL and the upper surface 79 of the bottom plate 78 is properly called an internal space IS.

In addition, an opening 76, through which the exposure light EL passes, is formed in the center of the bottom plate 78. In the present embodiment the XY cross sectional shape of the exposure light EL (namely, the shape of the projection area AR) is substantially rectangular, with its longitudinal directions set in the X axial directions; furthermore, the opening 76 is formed substantially rectangularly in accordance with the XY cross sectional shape of the exposure light EL (the shape of the projection area AR).

The nozzle member 70 (the bottom plate 78) has a flat lower surface 77 that is substantially parallel to the XY plane. The lower surface 77 is provided so that it surrounds the opening 76 (the optical path K of the exposure light EL). In addition, when the nozzle member 70 (the bottom plate 78) and the substrate P (the substrate stage 4) are opposed to one another, part of the lower surface 77 is positioned between the lower surface T1 of the last optical element FL of the projection optical system PL and the substrate P, and the liquid LQ own be held between the substrate P (the substrate stage 4) and the lower surface 77. In addition, the nozzle member 70 (the bottom plate 78) is configured and disposed so that, when the nozzle member 70 (the bottom plate 78) and the substrate P (the substrate stage 4) are opposed to one another, the lower surface 77 is most proximate to the substrate P, which is held by the substrate stage 4. In addition, in the present embodiment, the nozzle member 70 (the bottom plate 78) is disposed so that, when the nozzle member 70 (the bottom plate 78) and the substrate P (the substrate stage 4) are opposed to one another, the lower she 77 of the nozzle member 70 is substantially parallel to the front surface of the substrate P, which is held by the substrate stage 4. In the explanation below, the lower surface 77 of the nozzle member 70 (the bottom plate 78) is properly called the land surface 77. In the present embodiment, the external shape of the land surface 77 is substantially square.

The liquid LQ that forms the immersion area L contacts the bottom plate 78 and the last optical element FL. The land surface 77 is lyophilic with respect to the liquid LQ, and the contact angle of the liquid LQ with respect to the land surface 77 is less than 40°, and is preferably less than 10°. In the present embodiment, the bottom plate 78, which has the land surface 77, is formed from titanium and is lyophilic (hydrophilic). Furthermore, the land surface 77 is surface treated to increase its lyophilicity.

The supply ports 12 contact the internal space IS and are capable of supplying the liquid LQ thereto. Supply passageways 14, which connect to the supply ports 12, are formed inside the nozzle member 70, and the supply ports 12 are connected to the liquid supply apparatus 11 via the supply passageways 14 and the supply pipes 13. In the present embodiment, the supply ports 12 are provided at the outer sides of the optical path space K of the exposure light EL at prescribed positions on the opposite sides of the optical path space K that are in the Y axial directions.

In addition, the nozzle member 70 comprises discharge ports 16, which discharge (exhaust) the gas in the internal space IS to an external space (that includes the atmospheric space) OS. The discharge ports 16 are connected to the internal space IS. In the present embodiment, the discharge ports 16 are provided on the outer sides of the optical path space K of the exposure light EL at prescribed positions on the opposite sides of the optical path space K that in the X axial directions. The gas in the internal space IS can be discharged to the external space OS via the discharge ports 16 and discharge passageways 15, which are formed inside the nozzle member 70.

Next, the recovery port 22 will be explained. The substrate P is capable of moving to a position that opposes the recovery port 22, which can recover the liquid LQ on the substrate P from above the substrate P, which is held by the substrate stage 4. In the present embodiment, the recovery port 22 is provided on the outer side of the supply ports 12 and the discharge ports 16 with respect to the optical path space K, and is provided annularly so that it surrounds the optical path space K, the land surface 77, the supply ports 12, and the discharge ports 16. The recovery port 22 is connected to the liquid recovery apparatus 21, which includes a suction apparatus such as a vacuum system, that is capable of recovering the liquid LQ via a recovery passageway 24 and the recovery pipes 23. Furthermore, the recovery port 22 does not have to be disposed so that it is further spaced apart from the optical path space K than the supply ports 12 are.

The porous member 25, which has a plurality of holes, is disposed in the recovery port 22. The porous member 25 is a member that recovers the liquid LQ and has a plurality of holes that are capable of recovering (capable of transmitting) the liquid LQ. In the present embodiment, the porous member 25 is a mesh member that is made of titanium and comprises a plate shaped base material of a prescribed thickness and a plurality of holes that are formed so that they pass through the base material in the thickness directions. The porous member 25 is disposed at the outer side of the optical path space K of the exposure light EL, and the liquid LQ on the substrate P, which opposes the porous member 25, is recovered via the porous member 25.

In addition, the recovery port 22 (the porous member 25) is disposed at the our side of the land surface 77 with respect to the optical path space K of the exposure light EL. The porous member 25 has a lower surfaced 26, and the liquid LQ on the substrate P, which opposes the lower surface 26 of the porous member 25, is recovered via the porous member 25. In the present embodiment, the lower surface 26 of the porous member 25 is a substantially flat surface that is substantially parallel to the XY plane and is substantially flush with the land surface 77. Accordingly, in the present embodiment, when the lower surface 26 of the porous member 25 and the substrate P are opposed to one another, the lower surface 26 of the porous member 25 is substantially parallel to the front surface of the substrate P.

The liquid recovery apparatus 21 is capable of recovering the liquid LQ that forms the immersion area LR via the holes of the porous member 25. The liquid LQ that passes through the holes of the porous member 25 is recovered by the liquid recovery apparatus 21 via the recovery passageway 24 and the recovery pipes 23.

In the present embodiment, the immersion system 1 is configured so that the liquid LQ recovery ability varies with the region of the nozzle member 70. In the immersion system 1 of the present embodiment, the liquid LQ recovery ability is different for each region of the porous member 25, which is disposed in the recovery port 22. Here, the recovery ability of the liquid LQ is defined so that it includes the amount (quantity) of recoverable liquid per unit of area over a prescribed surface (herein, the lower surface 26) at which the liquid LQ is recovered.

The recovery ability at each region of the porous member 25 is set in accordance with its position with respect to the optical path space K of the exposure light EL. In the present embodiment, the recovery ability at each region of the porous member 25 is set in accordance with its distance from the optical path space K of the exposure light EL.

In the present embodiment, the porous member 25 comprises a first area 25A, which has a first recovery ability, and a second area 25B, which has a second recovery ability that is higher than the first recovery ability. The second area 25B is disposed at a position that is further from the optical path space K of the exposure light EL than the first area 25A is. In the present embodiment, the first area 25A is disposed substantially rectangularly (square shaped) so that it surrounds the optical path space K of the exposure light EL (the land surface 77). The second area 25B is disposed substantially rectangularly (square shaped) so that it surrounds the first area 25A. Namely, the recovery ability of the first area 25A, which is close to the land surface 77 of the porous member 25, is comparatively low, and the recovery ability of the second area 25B, which is further from the land surface 77 than the first area 25A is, is comparatively high. In addition, the land surface 77 is an area that does not have any recovery ability.

In the present embodiment, making the structure at each region of the porous member 25 different makes the recovery abilities in the regions different. In the present embodiment, making the size of the holes at each region of the porous member 25 different makes the recovery abilities different.

Figure 6:
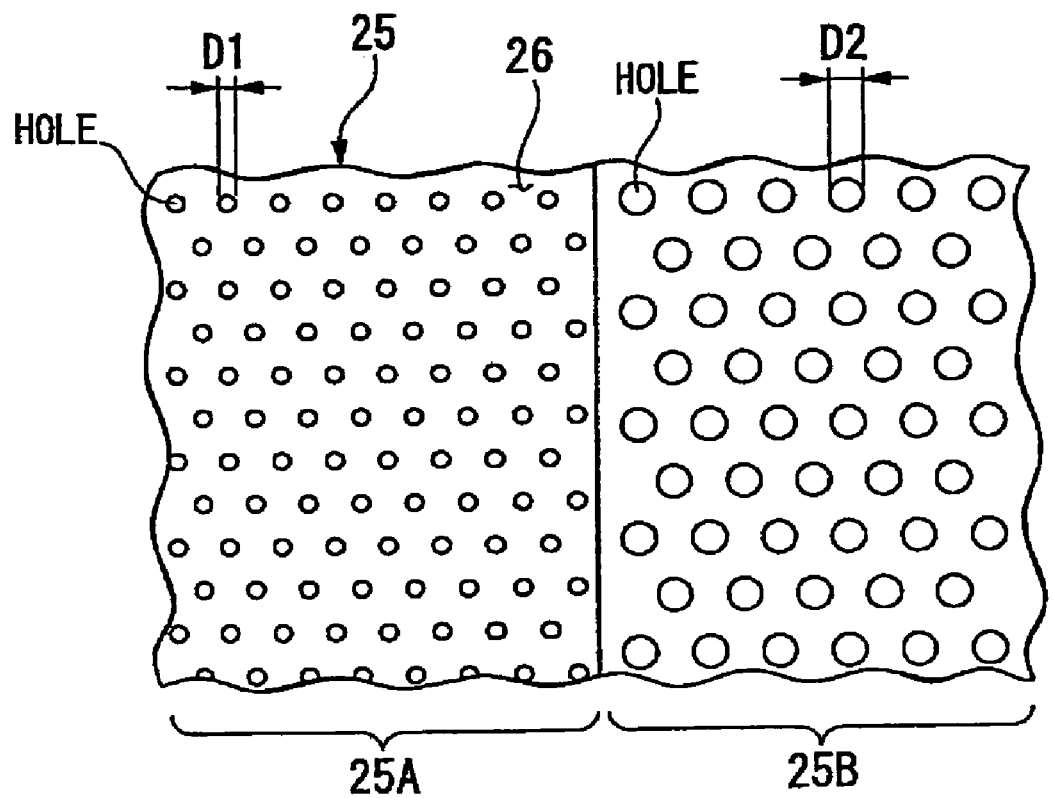
FIG. 6 is a schematic drawing that shows one example of a porous member.

FIG. 6 is an enlarged view that shows part of the porous member 25, viewed from the lower surface 26 side. As shown in FIG. 6, the size of the holes of the first area 25A and the size of the holes of the second area 25B are different. Specifically, holes of a first size (e.g., diameter) D1 are formed in the first area 25A, and holes of a second size D2, which is greater than the first size D1, are formed in the second area 25B. Namely, the liquid LQ recovery ability (the first recovery ability) of the first area 25A, which has small holes, is lower than the liquid LQ recovery ability (the second recovery ability) of the second area 25B, which has large holes. Thus, in the present embodiment, mating the sizes of the holes of the first and second areas 25A, 25B of the porous member 25 die makes the liquid LQ recovery abilities at the first and seed areas 25A, 25B different.

Furthermore, in the present embodiment as discussed above, the porous member 25 is made of titanium and is lyophilic (hydrophilic) with respect to the liquid LQ. Furthermore, the porous member 25 may be surface treated to increase its lyophilicity.

The following explains a method of exposing the subsume P with an image of the pattern of the mask M using the expose apparatus EX that is configured as discussed above.

The control apparatus 7 drives the liquid supply apparatus 11 and the liquid recovery apparatus 21 in order to fill the optical path space K of the exposure light EL with the liquid LQ. After the liquid LQ that is fed from the liquid supply apparatus 11 flows through the supply pipes 13, it is supplied through the supply passageways 14 to the internal space IS of the nozzle member 70 via the supply ports 12. The liquid LQ that is supplied from the supply ports 12 to the internal space IS fills the internal space IS and then flows into the space between the land surface 77 and the substrate P (the substrate stage 4) via the opening 76, fills the optical path space K of the exposure light EL, and thereby forms the immersion area LR. Thus, by supplying the liquid LQ from the supply ports 12 to the internal space IS between the last optical element FL and the bottom plate 78, the immersion system 1 fills the optical path space K of the exposure light EL between the last optical element FL (the projection optical system PL) and the substrate P (the substrate stage 4) with the liquid LQ and holds Me liquid LQ in part of the space between the nozzle member 70 and the substrate P (the substrate stage 4), thereby forming the immersion area LR. At this time, the liquid recovery apparatus 21 recovers a prescribed amount of the liquid LQ per unit of time. The liquid recovery apparatus 21, which comprises the suction apparatus such as a vacuum system, can recover the liquid LQ that is present between the porous member 25, which is disposed in the recovery port 22, and the substrate P via the porous member 25 by negatively pressurizing the recovery passageway 24. The liquid LQ that is recovered from the porous member 25 flows into the recovery passageway 24 and through the recovery pipes 23, and is then recovered by the liquid recovery apparatus 21. The control apparatus 7 controls the immersion system 1 so that the liquid supply operation with the liquid supply apparatus 11 and the liquid recovery operation with the liquid recovery apparatus 21 are performed in parallel during the exposure of the substrate P, and thereby the liquid immersion area LR of the liquid LQ is locally formed on part of the area of the substrate P so that the optical path space K is filled with the liquid LQ. Furthermore, the control apparatus 7 radiates the exposure light EL onto the substrate P while moving the substrate P in one of the Y axial directions with respect to the optical path space K in a state wherein the optical path space K of the exposure light EL is filled with the liquid LQ.

The nozzle member 70 can satisfactorily hold the liquid LQ between the land surface 77 and the front surface of the substrate P, which makes it possible to satisfactorily fill the optical path space K of the exposure light EL between the last optical element FL and the substrate P and the space between the land sure 77 and the substrate P with the liquid LQ, even, for example, during the exposure of the substrate P. In addition, in the present embodiment, the nozzle member 70 comprises the discharge ports 16, which prevents the problem we bubbles are generated in the liquid LQ that fills the optical path space K. Accordingly, the exposure lift EL can reach the subsume P satisfactorily.

With such a scanning type exposure apparatus, there is a possibility that, when the substrate P is moved in the state wherein the optical path space K is filled with the liquid LQ, the liquid LQ will not be satisfactorily recovered, e.g., the liquid LQ will leak to the outer side of the space between the substrate P and the nozzle member 70. In the present embodiment as discussed above, the land surface 77 is provided so that it surrounds the optical path space K of the exposure light EL, and the liquid LQ can be held between the land surface 77 and the front surface of the substrate P; however, there is a possibility that, for example, the liquid LQ will leak when the substrate P is moved due to the recovery ability of the recovery port 22, which is disposed at the outer side of the land surface 77 with respect to the optical path space K of the exposure light EL.

Figure 7A:
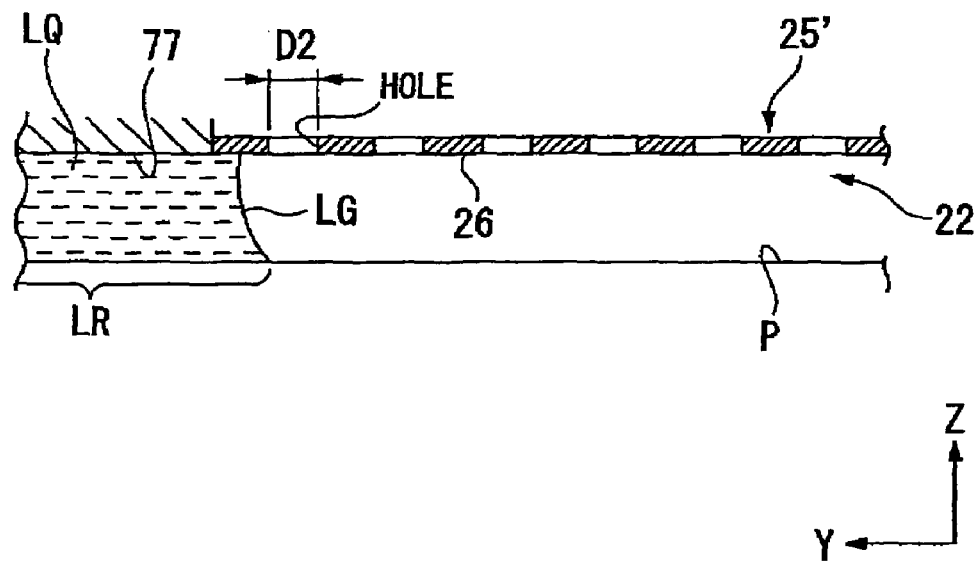
FIG. 7A is a schematic drawing that shows one example of the behavior of a liquid.
Figure 7B:
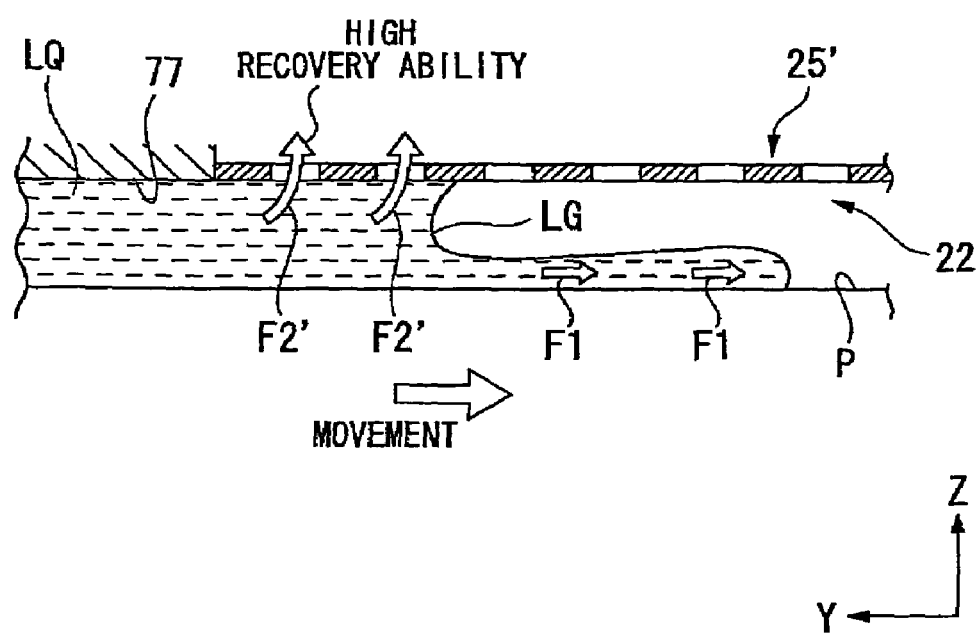
FIG. 7B is a schematic drawing that shows one example of the behavior of the liquid.

As shown in FIG. 7A and FIG. 7B for example, let us consider a case wherein the diameters of the holes of a porous member 25', which is disposed in the recovery port 22, are uniform, and the recovery ability of the porous member 25' is uniform. Starting in a first state wherein the liquid LQ is held between the land surface 77 and the front surface of the substrate P as shown in FIG. 7A, if the substrate P is moved by just a prescribed distance at a prescribed speed in the –Y direction with respect to the optical path space K and the liquid LQ thus transitions to a second se, as shown in FIG. 7B, during which the substrate P is in motion, then an interface LG between the liquid LQ of the immersion area LR and the space on the outer side of the immersion area LR moves in the –Y direction, and the liquid LQ that contacts the lower surface 26 of the porous member 25' is recovered via the holes of the porous member 25'. The principal flow components that are generated in the liquid LQ in the second state are: a flow component F1 that flows in the –Y direction, which is generated by the movement of the substrate P in the –Y direction; and a flow component F2', which is generated by the recovery operation of the recovery port 22, that flows in substantially the upward direction (the +Z direction) toward the holes of the porous member 25'.

In FIG. 7A and FIG. 7B, the land surface 77 does not have any liquid LQ recovery ability, and therefore the flow component F2' that flows in the +Z direction is not generated in the liquid LQ that is present below the land surface 77, but the flow component F2' that flows in the +Z direction is generated in the liquid LQ that moves from below the land surface 77 to below the porous member 25'. Here, if the recovery ability of the porous member 25', which is disposed at a position at which it adjoins the land surface 77, is comparatively high (e.g., if it has the second recovery ability discussed above), then the flow component F2' that flows in the +Z direction is abruptly generated in the liquid LQ that moves from below the land surface 77 to below the porous member 25'. If the flow component F2' that flows in the +Z direction is abruptly generated in the liquid LQ that moves in the –Y direction, then there is a possibility that the shape of the interface LG will become irregular, the liquid LQ will leak, or that the liquid LQ that leaks will form a drop and remain on the front surface of the substrate P. For example, as shown in FIG. 7B, just the liquid LQ that is in the vicinity of the front surface of the substrate P moves together with the substrate P in the –Y direction, and a thin film of the liquid LQ forms on the substrate P. If part of that thin film separates from the liquid LQ that forms the immersion area LR, then there is a possibility that a phenomenon will occur wherein that liquid LQ will form a drop and remain on the front surface of the substrate P.

Namely, if the behavior (flow components) of the liquid LQ changes suddenly, then there is a strong possibility that the liquid LQ will leak and remain on the substrate P. It is conceivable that the behavior of the liquid LQ will change more suddenly if the difference in the recovery abilities of adjoining surface—of the surface that oppose the substrate P—increases in the direction in which the interface LG of the liquid LQ moves. In FIG. 7A and FIG. 7B, the land surface 77, which does not have any recovery ability, and the lower surface 26 of the porous member 25, which has a high recovery ability, are adjoining, and the difference in the recovery abilities of the land surface 77 and the porous member 25' is large; therefore, the behavior of the liquid LQ changes suddenly.

Figure 8A:
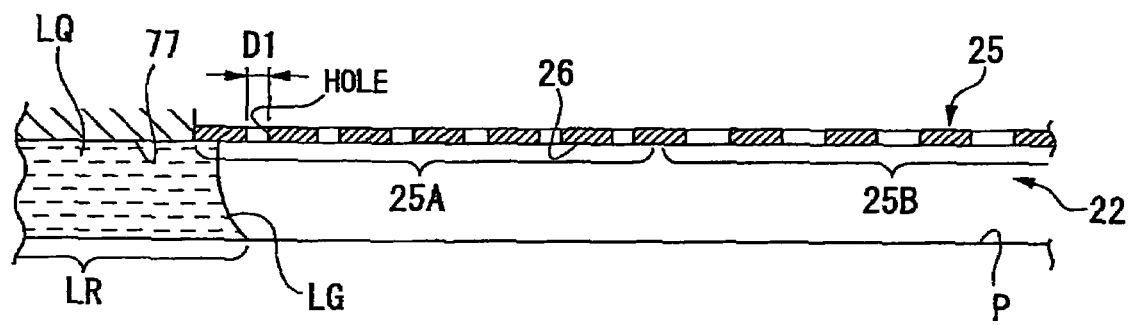
FIG. 8A is a schematic drawing that shows one example of the behavior of the liquid according to the first embodiment.
Figure 8B:
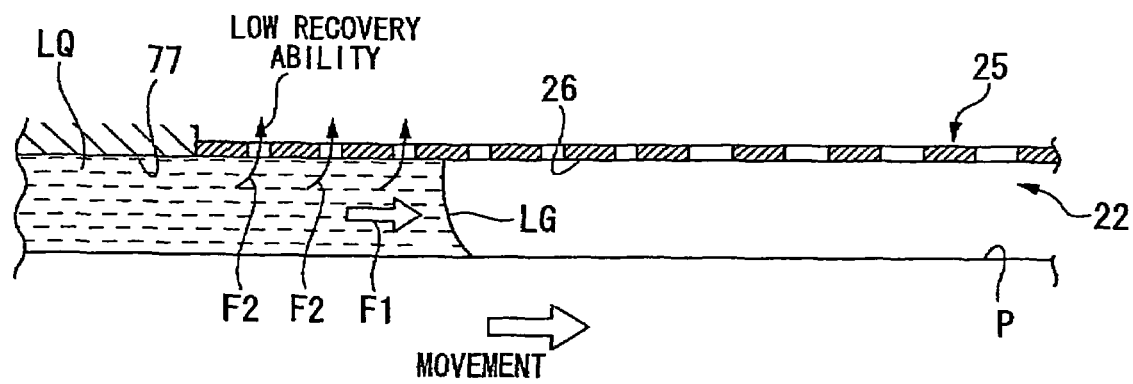
FIG. 8B is a schematic drawing that shows one example of the behavior of the liquid according to the first embodiment.
Figure 9:
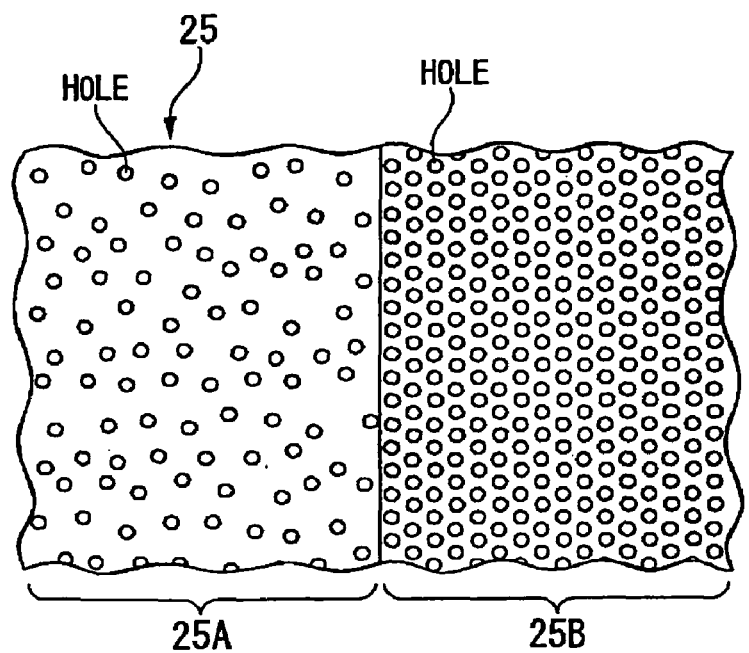
FIG. 9 is a schematic drawing that shows one example of the porous member.

FIG. 8A and FIG. 8B are schematic drawings for explaining the behavior of the liquid LQ in a state wherein the porous member 25 according to the present embodiment is disposed in the recovery port 22. As discussed above, the porous member 25 is disposed at a position at which it adjoins the land surface 77, the same as the case for FIG. 7A and FIG. 7B; however, the first area 25A, which has the comparatively small first recovery ability, is disposed at a position at which it is adjacent to the land surface 77, and the second area 25B, which has the second recovery ability that is higher than the first recovery ability, is disposed at a position at which it is further from the land surface 77 than the first area 25A is. Staring from the first state wherein the liquid LQ is held between the land surface 77 and the front surface of the substrate P as shown in FIG. 5A, if the substrate P is moved by just the prescribed distance at the prescribed speed in the –Y direction with respect to the optical path space K, and the liquid LQ thus transitions to the second state, as shown in FIG. 8B, during which the substrate P is in motion, then the liquid LQ is recovered via the holes of the porous member 25. In FIG. 8A and FIG. 9B, the recovery ability of the first area 25A of the porous member 25, which is disposed at a position at which it adjoins the land surface 77, is comparatively low, and therefore the flow component F2, which is generated by the recovery operation of the recovery port 22, that flows in substantially the upward direction (the +Z direction) toward the holes of the porous member 25, is comparatively smaller than the flow component F1 of the liquid LQ that flows in the forward travel direction (the –Y direction) of the P. This prevents a sudden change in the behavior of the liquid LQ from occurring.

Namely, in FIG. 8A and FIG. 8S, the recovery ability of the first area 25A, which is close to the land surface 77, is comparatively low, and the difference between the recovery ability of the land 77 and the recovery ability of the first area 25A of the porous member 25 is small, and consequently the behavior of the liquid LQ does not change suddenly. Accordingly, the first area 25A of the porous member 25 can satisfactorily recover the liquid LQ without causing a sudden change in the behavior of the liquid LQ.

Because the second area 25B, which has a high recovery ability, is disposed at the outer side (around) the first area 25A, the liquid LQ that is not recovered by the first area 25A can be recovered by the second area 25B. Accordingly, the liquid LQ that is present in the space between the substrate P and the nozzle member 70 can be satisfactorily recovered via the recovery port 22 (the porous member 25) without leaking to the outer side of that spare. Here, the difference between the recovery ability of the first area 25A of the porous member 25 and the recovery ability of the second area 25B is small, and therefore the porous member 25 can satisfactorily recover the liquid LQ without causing sudden changes in the behavior of the flow of the liquid LQ.

As explained above, making the liquid LQ recovery abilities in the regions of the porous member 25 different makes it possible to prevent sudden changes in the behavior of the liquid LQ and to prevent the liquid LQ from leaking or forming a drop on the substrate P and remaining thereupon, even when the porous member 25 is used to recover the liquid LQ. Furthermore, in the present embodiment, in order to fill the optical path space K of the exposure light EL with the liquid LQ satisfactorily: the land surface 77 is provided so that it surrounds the optical path space K of the exposure light EL, and the liquid LQ can be held between the land surface 77 and the front surface of the subsume P; the first area 25A, which has the comparatively small first recovery ability, is disposed around the land surface 77; and the second area 25B, with has the second recovery ability, is disposed around the first area 25A Thereby, the differences in the recovery abilities (i.e., the difference in the recovery abilities between the land surface 77 and the first area 25A of the porous member 25 and the difference in the recovery abilities between the first area 25A and the second area 25B of the porous member 25) of the regions of the lower surface of the nozzle member 70 are reduced, which makes it possible to recover the liquid LQ satisfactorily while filling the optical path space K of the exposure light EL with the liquid LQ.

For ample, it is effective to increase the recovery ability of the recovery port 22 (the porous member 25) in order to recover the liquid LQ without leaving any of it behind on the substrate P. Nevertheless, if the recovery abilities of the porous member 25, which is disposed in the recovery port 22, are uniformly increased, then, as was explained referencing FIG. 7A and FIG. 7B, there is a possibility that the difference in the recovery abilities of the land surface 77 will cause sudden changes in the behavior (e.g., the interface) of the liquid LQ, and that the liquid LQ will leak or form a drop and remain on the substrate P. Moreover, if the recovery abilities of the porous member 25 are uniformly lowered in order to reduce the difference between the recovery ability of the land surface 77 and the recovery ability of the porous member 25, then recovering the liquid LQ without leaving any behind becomes problematic. In the present embodiment, making the liquid LQ recovery abilities in the regions of the porous member 25 different makes it possible to prevent the differences in the recovery abilities of the lower surface of the nozzle member 70 from increasing, and thereby to recover the liquid LQ satisfactorily without it leaking.

In addition, it is possible to prevent, for example, the liquid LQ leakage satisfactorily, even if the substrate P (the interface of the immersion area LR) moves in any direction, because the first area 25A is disposed so that it surrounds the optical path space K (the land surface 77) of the exposure light EL, and the second area 25B is disposed so that it surrounds the first area 25A.

Furthermore, in the embodiment discussed above, the sizes of the holes of each region of the porous member 25 are made different in order to make the recovery abilities of the regions different; however, the recovery abilities of the regions of the porous member 25 may be made different by making the densities of the holes of the regions of the porous member 25 different. For example, as shown by the schematic drawing in FIG. 9, decreasing the densities of the holes of the first area 25A of the porous member 25, which is close to the optical path space K of the exposure light EL, and increasing the densities of the holes of the second area 25B, which is further from the optical path space K of the exposure light EL than the first area 25A is, makes it possible to make the recovery ability of the first area 25A lower than the recovery ability of the second area 25B.

Figure 10:
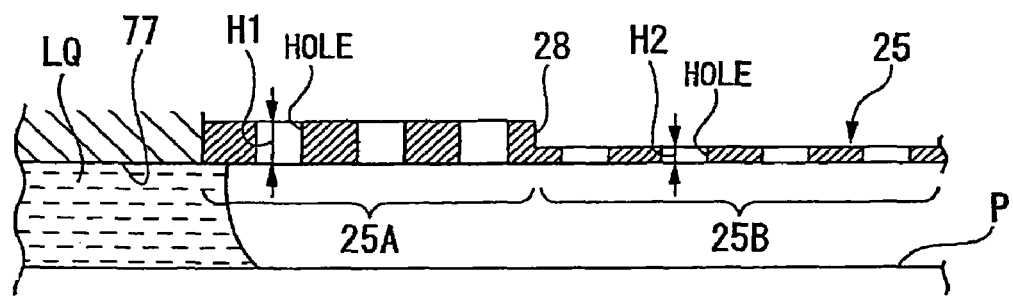
FIG. 10 is a schematic drawing that shows one example of the porous member.

In addition, in the embodiment discussed above, the porous member 25 comprises a plate shaped base material 28, which has a prescribed thickness, and a plurality of holes, which are formed so that they pass through the base material 28 in the thickness directions; however, the recovery abilities of the regions of the porous member 25 can be made different by making the thickness of the base material 28 of the porous member 25 different in each region. For example, as shown by the schematic drawing in FIG. 10, setting the portion of the base material 28 in the first area 25A, which is close to the optical path space K (the land surface 77) of the exposure light EL, to a first thickness H1, and setting the portion of the base material 28 in the second area 25B, which is further from the optical path space K of the exposure light EL than the first area 25A is, to a second thickness H2 that is less than the first thickness H1 makes it possible to set the recovery ability of the first area 25A lower than the recovery ability of the second area 25B. The flow resistance of the liquid LQ increases because the passageways of the holes that are formed in the base material 28 in the first ara 25A with the first thickness H1 are longer than the passageways of the holes that are formed in the base material 28 in the second area 25B with the first thickness H2. Accordingly, making the base material 28 in the first area 25A thick and the base material 29 in the second area 25B thin makes it possible to set the recovery ability of the first area 25A lower than the recovery ability of the second area 25B.

Furthermore, the recovery ability of the first area 25A and the recovery ability of the second area 25B may made different by making the shapes of the holes of the first area 25A and the shapes of the holes of the second area 25B different. For example, it is possible to make the holes of the first area 25A polygonal (e.g., hexagonal) and the holes of the second area 25B circular. In the case of polygonal holes, the flow resistance of the liquid LQ when it flows through those holes is larger than the flow resistance of the liquid LQ when it flows through the circular holes; consequently, the recovery ability of the first area 25A can be made lower than the recovery ability of the second area 25B by providing polygonal holes to the first area 25A and circular holes to the second area 25B.

Furthermore, the embodiment discussed above explained that the porous member 25 comprises the first and second areas 25A, 25B (regions) that have two different recovery ability levels; however, regions (areas) with an arbitrary plurality of three or more recovery ability levels may be provided. Namely, in the embodiment discussed above, the recovery port 22 (the porous member 25) is divided into two areas that have different recovery abilities, but it may be divided into Free or more areas that have differ recovery abilities.

In addition, in the embodiment discussed above, the recovery abilities of adjacent regions of the recovery port 22 (the porous member 25) are changed in steps, but the recovery abilities of the regions of the recovery port 22 (the lower surface 26 of the porous member 25) may be varied continuously. For example, the recovery abilities of the regions of the recovery port 22 (the porous member 25) may be set so that they increase gradually as the distance from the optical path space K of the exposure light EL to the outer side increases.

Second Embodiment

The following explains the second embodiment, referencing FIG. 11 through FIG. 14. In the explanation below, cord parts that are identical or equivalent to those in the first embodiment discussed above are assigned identical symbols, and the explanations thereof are therefore abbreviated or omitted.

Figure 11:
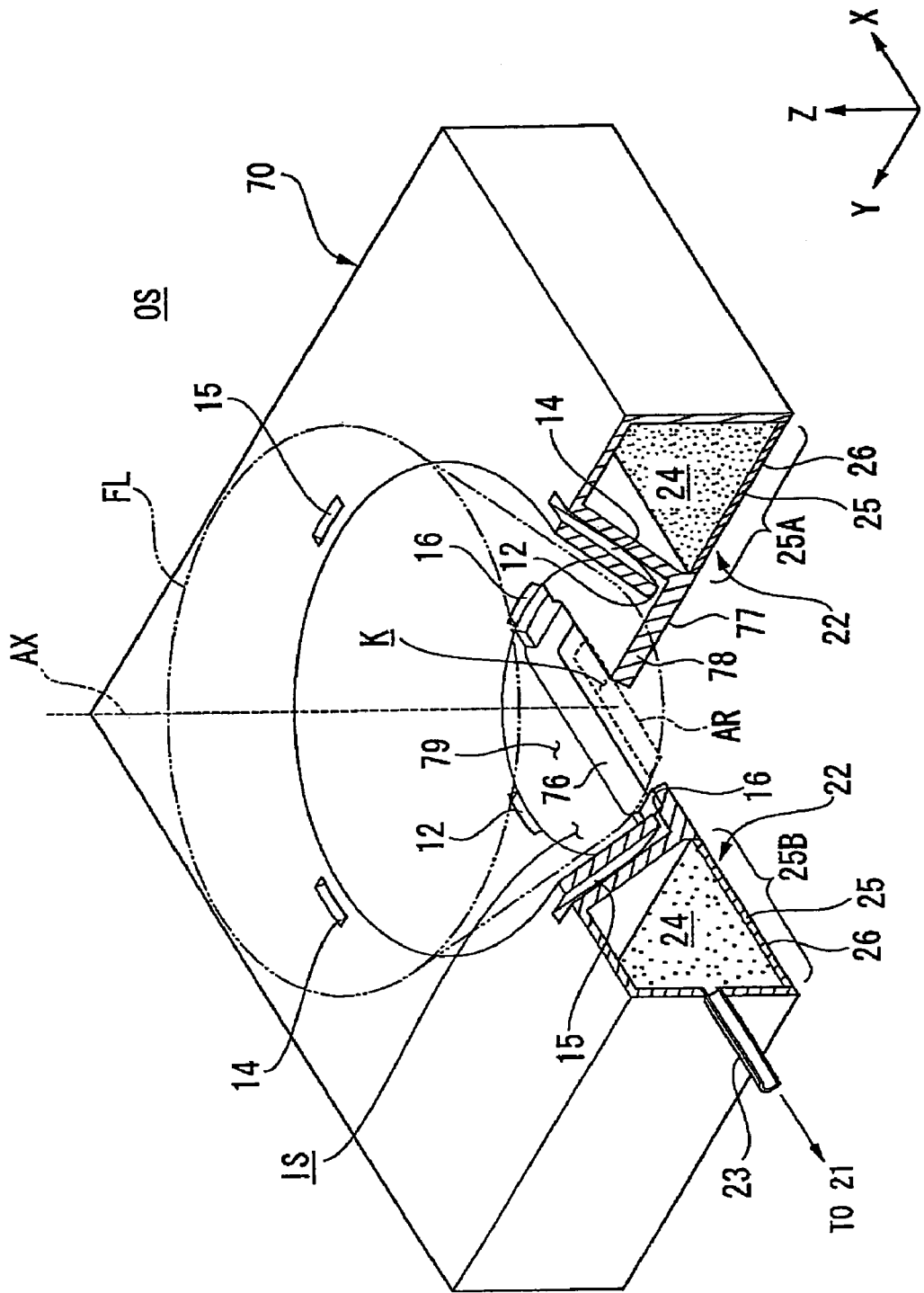
FIG. 11 is a partial broken, schematic, oblique view that shows the vicinity of the nozzle member according to a second embodiment.
Figure 12:
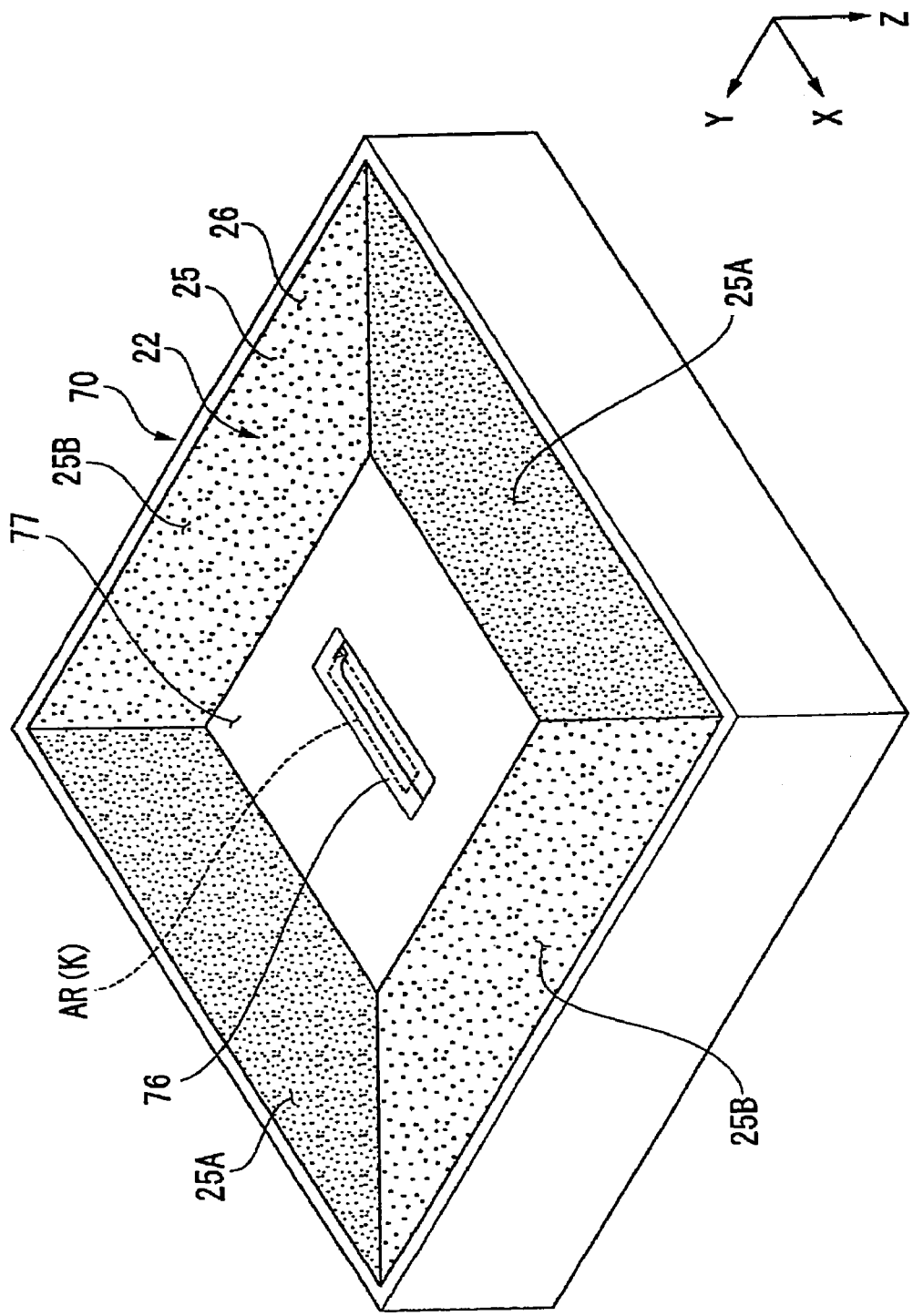
FIG. 12 is an oblique view of the nozzle member according to the second embodiment viewed from the lower side.
Figure 13:
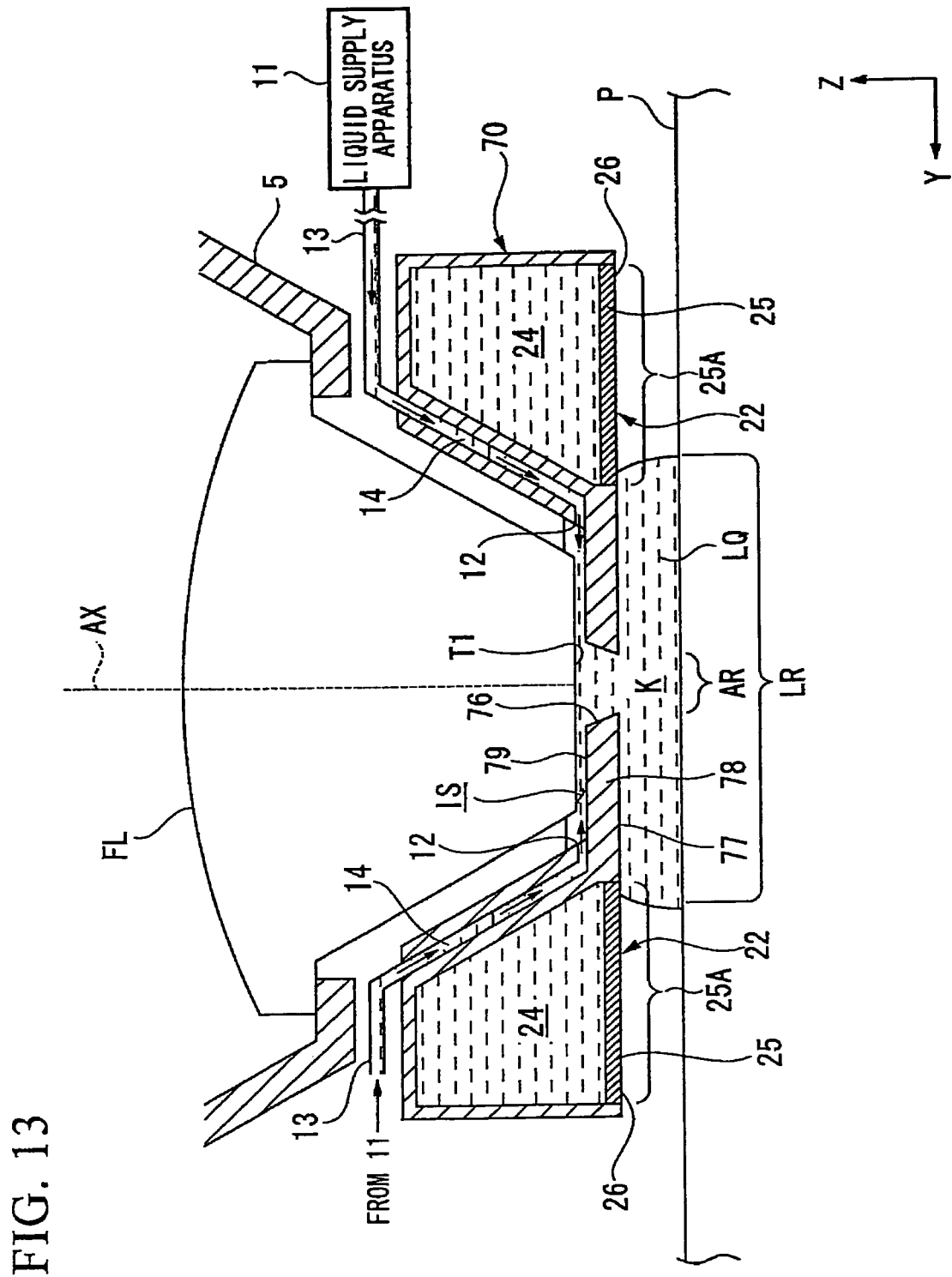
FIG. 13 is a side cross sectional view, parallel to the YZ plane, of the nozzle member according to the second embodiment.
Figure 14:
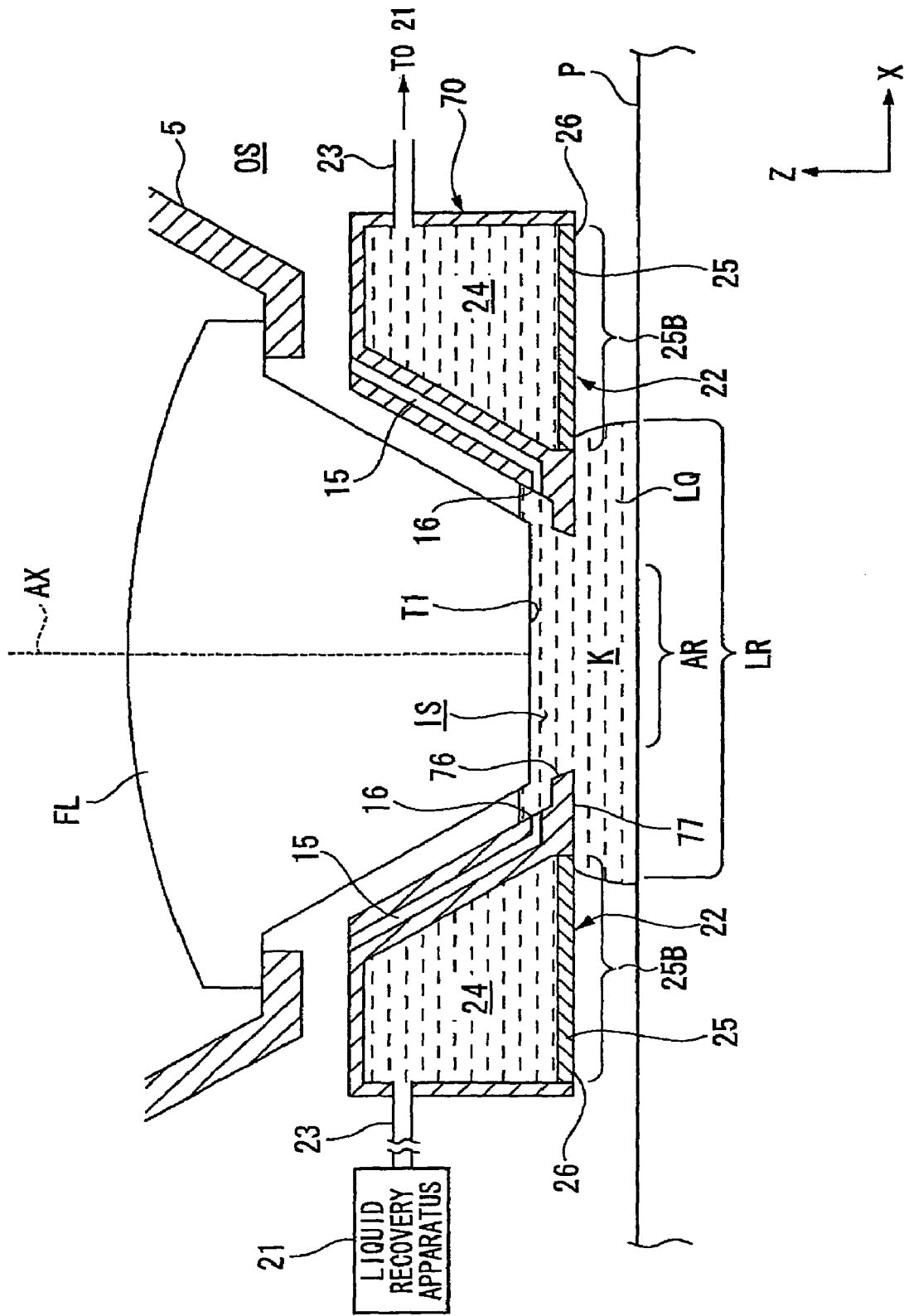
FIG. 14 is a side cross sectional view, parallel to the XZ plane, of the nozzle member according to the second embodiment.

FIG. 11 is a partial, broken, schematic, oblique view that shows the vicinity of the nozzle member 70 according to the second embodiment; FIG. 12 is an oblique view of the nozzle member 70, viewed from the lower side; FIG. 13 is a side cross sectional view that is parallel to the YZ plane; and FIG. 14 is a side cross sectional view that is parallel to the XZ plane. The characteristic portion of the present embodiment is that the recovery ability of each region of the porous member 25 is set in accordance with its orientation with respect to the optical path spare K of the exposure light EL.

La the second embodiment as well, the nozzle member 70 comprises the land surface 77 between which and the front surface of the substrate P the liquid LQ can be held; in addition, the recovery port 22 is formed so that it surrounds the land surface 77 and the optical path space K of the exposure light EL. The porous member 25 is formed in the recovery port 22. Furthermore, in the present embodiment, the lower surface 26 of the porous member 25 is substantially parallel to the front surface of the substrate P and is substantially flush with the land surface 77.

In the present embodiment as well, the control apparatus 7 performs an exposure while moving the exposure light EL and the substrate P relative to one another in the prescribed scanning directions (here, the Y axial directions). Furthermore, the recovery ability of each region of the porous member 25 is set in accord with movement conditions of the substrate P.

Specifically, the first areas 25A of the porous member 25 are disposed lateral to the optical path space K of the exposure light EL in the Y axial directions (one on each side), and the second areas 25B are disposed lateral to the optical path space K of the exposure light EL in the X axial directions, which intersect the Y axial directions (one on each side). In addition, the second recovery ability of the second areas 25B is higher then the first recovery ability of the first areas 25A. In the present embodiment, holes of the first size D1 are formed in the first areas 25A, and holes of the second size D2, which is larger than the first size D1, are formed in the second areas 25B. Namely, the first areas 25A, which have a low recovery ability, are disposed lateral to the optical path space K (the land surface 77) of the exposure light EL in the directions that are parallel to the travel direction of the substrate P, and the second areas 25B, which have a high recovery ability, are disposed lateral to the optical path space K (the land surface 77) of the exposure light EL in the directions that intersect the travel direction of the substrate P. The first areas 25A arm provided on the opposite sides of the land surface 77 that are in the Y axial directions, and the second areas 251 are provided on the opposite sides of the land surface 77 that are in the X axial directions. In addition, parts of the second areas 25B are disposed at the opposite sides of the first areas 25A that are in the X axial directions.

In the present embodiment, the first areas 25A are formed in shapes (trapezoids) that gradually widen in the X directions as the distance from the optical path space K of the exposure light EL increases in the Y axial directions. The second areas 25B are formed in shapes (trapezoids) that gradually widen in the Y directions as the distance from the optical path space K of the exposure light EL increases in the X axial directions.

Thus, the recovery ability of each region of the porous member 25 may be set by taking the movement of the substrate P during the exposure of the substrate P, e.g., the travel direction of the substrate P, into consideration. Referring to, for example, FIG. 7A and FIG. 7B, if there is a big change in the recovery abilities of the porous member 25 that is disposed in the directions that are parallel to the travel direction of the substrate P as explained above, then there is a possibility that the behavior of the liquid LQ will suddenly change and that the liquid LQ will leak; however, setting the recovery abilities of the porous member 25 that is disposed in the directions that are parallel to the travel direction of the substrate P so that they are low makes it possible to prevent sudden changes in the behavior of the liquid LQ from occurring, even if an exposure is performed while the substrate P is moved.

Furthermore, because the substrate P (the substrate stage 4) is moved not only in the Y axial directions, but also frequently in the X axial directions, e.g., when the substrate P is stepped, the second areas 25B, which have a high recovery ability, are provided at the opposite sides of the optical path space K (the land surface 77) of the exposure light EL that are in the X axial directions, which makes it possible to satisfactorily recover the liquid LQ via the second areas 25B and to prevent the immersion area LR from enlarging and the liquid LQ from leaking.

Furthermore, in the present embodiment, the sizes of the holes of the first areas 25A and the second areas 25B are made different, the same as in the first embodiment discussed above, in order to make the recovery abilities of the first 25A and the second areas 25B different; however, as discussed in the first embodiment as well for example, the densities of the holes in the first areas 25A and the second areas 25B, or the thicknesses of the base material of the porous member 25 in the first area 25A and in the second area 25B may be made different.

Furthermore, in the first and second embodiment discussed above, the lower surface 26 of the porous member 25 is substantially flush with the land surface 77, but there may be a step between the land surface 77 and the lower surface 26. For example, a step may be provided between the lower surface 26 and the land surface 77 so that, when the nozzle member 70 and the substrate P are opposed to one another, the lower surface 26 of the porous member 25 is more greatly spaced apart from the front surface of the substrate P than the land surface 77 is. In addition, the lower surface 26 of the porous member 25 may be parallel to the land surface 77, i.e., parallel to the front surface of the substrate P, or inclined with respect to the land surface 77 (the front surface of the substrate P) when the nozzle member 70 and the substrate P are opposed to one another.

Third Embodiment

Figure 15:
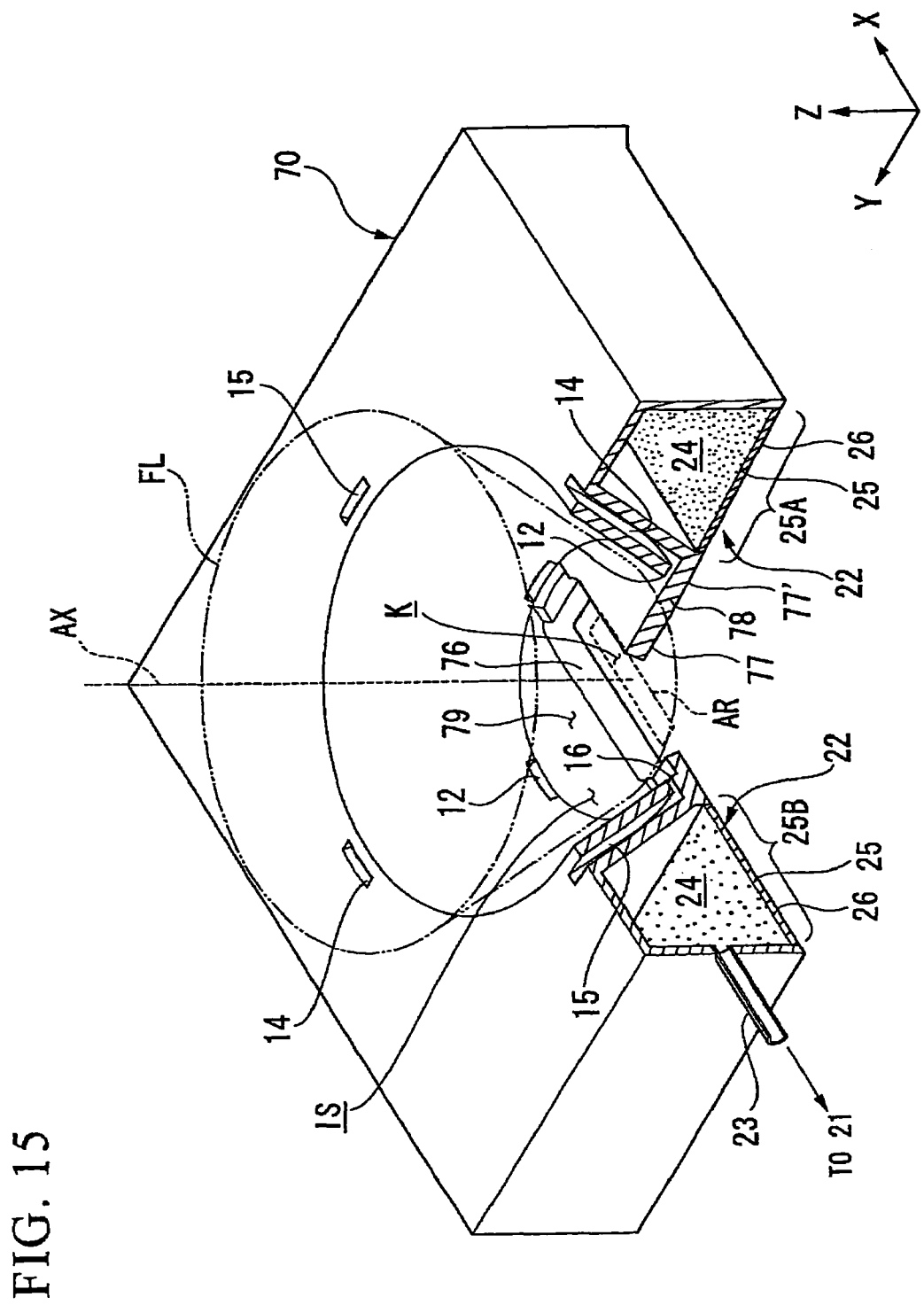
FIG. 15 is a partial, broken, schematic, oblique view that shows the vicinity of the nozzle member according to a third embodiment.
Figure 16:
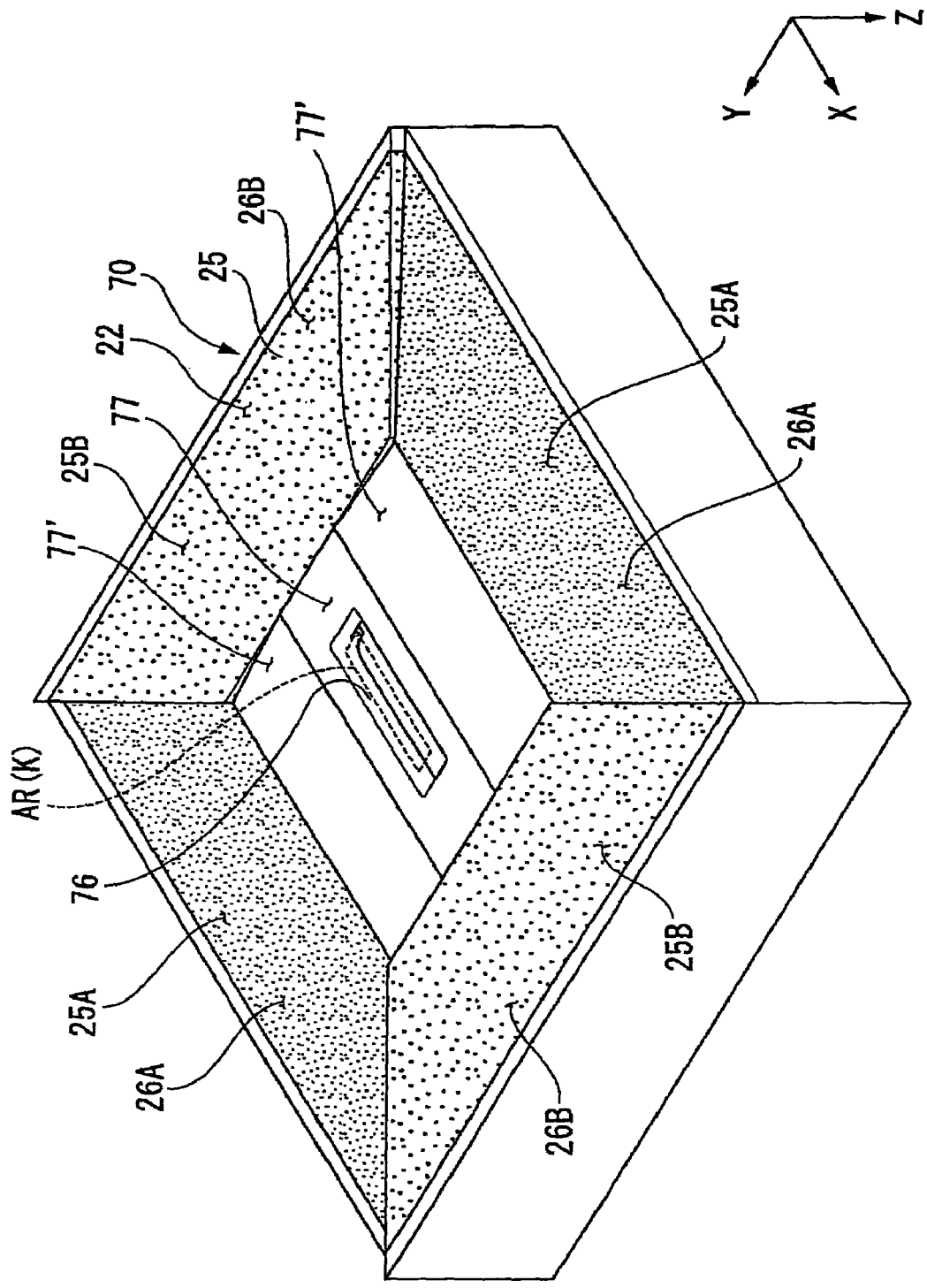
FIG. 16 is an oblique view of the nozzle member according to the third embodiment, viewed from the lower side.
Figure 17:
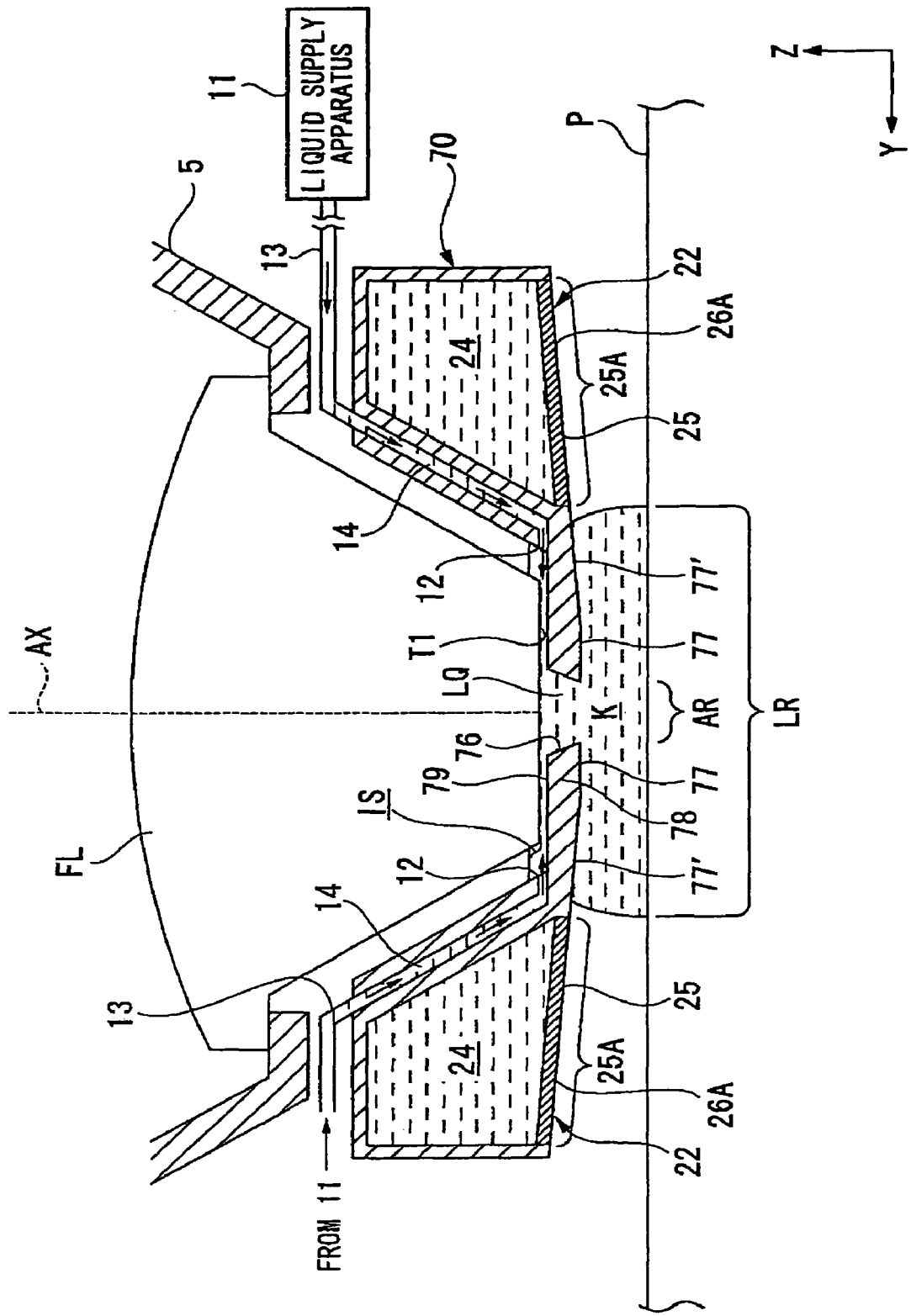
FIG. 17 is a side cross sectional view, parallel to the YZ plane, of the nozzle member according to the third embodiment.
Figure 18:
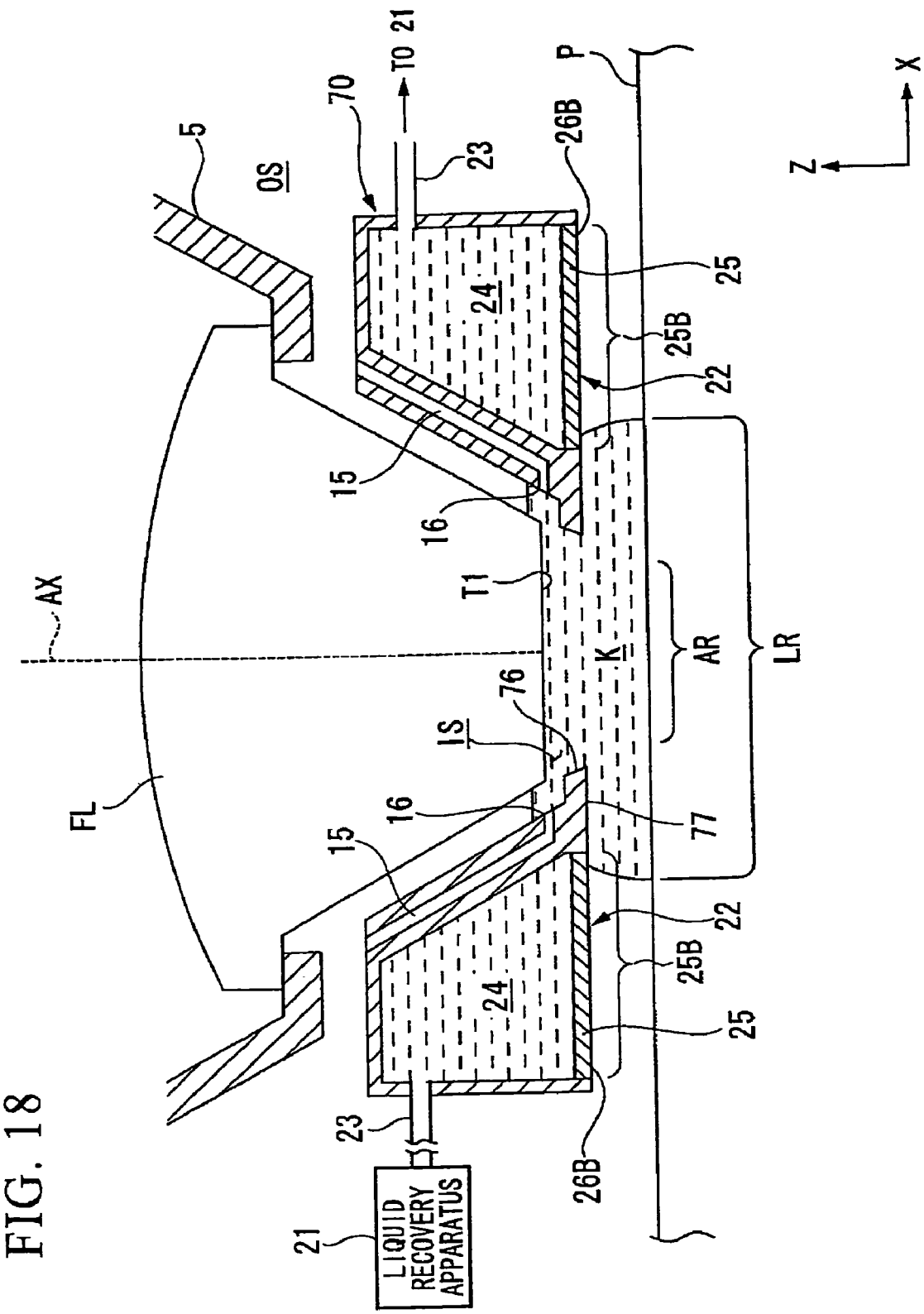
FIG. 18 is a side cross sectional view, parallel to the XZ plane, of the nozzle member according to the third embodiment.

The following explains a third embodiment, referencing FIG. 15 through FIG. 18. FIG. 15 is a partial, broken, schematic, oblique view that shows the vicinity of the nozzle member 70 according to the third embodiment; FIG. 16 is an oblique view of the nozzle member 70, viewed from the lower side; FIG. 17 is a side cross sectional view that is parallel to the YZ plane; and FIG. 18 is a side cross sectional view that is parallel to the XZ plane.

In the third embodiment as well, the nozzle member 70 comprises the land surface 77 between which and the front surface of the substrate P the liquid LQ can be held. In the embodiment, the en shape of the land surface 77 is rectangular, with its longitudinal directions set in the X axial directions, in accordance with the shape of the opt 76. Furthermore, similar to the first and second emboss discussed above, when the nozzle member 70 and the substrate P (the substrate stage 4) are opposed to one another, the land surface 77 is provided at region of the plurality of regions of the nozzle member 70 that is positioned closest to the substrate P, which is held by the substrate stage 4, and is substantially parallel to the front spice of the substrate P.

In the present embodiment, the nozzle member 70 is provided in the Y axial directions on the outer side of the land surfing 77 with respect to the optical path space K of the exposure light EL, and comprises second land surfaces 77', each of which is provided at a position that is further spaced apart from the front surface of the substrate P than the land sure 77 is. The second land surfaces 77' are surfaces that are inclined in the +Z direction with respect to the land surface 77. Namely, in the state in the nozzle member 70 and the substrate P are opposed to one another, each of the second land surfaces 77' is an inclined surface is inclined so that its distance to the front surface of the substrate P increases as its distance from the optical path space K of the exposure light EL increases in the Y axial directions. The second land surfaces 77' are provided on the opposite sides (one on each side) of the land surface 77 that are in the Y axial directions.

The land surface 77 and the second land surfaces 77' are provided with prescribed positional relationships so that, when the liquid LQ is present between the front surface of the substrate P and the second land surfaces 77', that liquid LQ does not separate from the second land surfaces 77'. Specifically, the second land surfaces 77' are provided at prescribed angles with respect to the land surface 77 so flat the liquid LQ that is present between the front surface of the substrate P and the second land surfaces 77' does not separate (delaminate) from the second land surfaces 77', even if the substrate P is moved in the state wherein the optical path space K is filled with the liquid LQ.

In the present embodiment, each of the second land surfaces 77' is provided continuously to the land surface 77. Namely, the −Y side edge of the second land surface 77', which is the edge that is closest to the optical path space K of the exposure light EL, that is provided on the +Y side of the optical path space K and the +Y side edge of the land surface 77 are provided at substantially the same position (height) with respect to the substrate P; furthermore the +Y side edge of the second land surface 77', which is the edge that is closest to the optical path space K of the exposure light EL, that is provided on the −Y side of the optical path space K and the −Y side edge of the land surface 77 are provided at substantially the same position (height) with respect to the substrate P.

In addition, similar to the embodiments discussed above, the recovery port 22 is formed so that it surrounds the optical path space K of the exposure light EL and the land surfaces 77, 77'. The porous member 25 is disposed in the recovery port 22.

In the present embodiment as well, the control apparatus 7 performs an exposure while moving the exposure light EL and the substrate P relative to one another in the prescribed scanning directions (here, the Y axial directions). Furthermore, the recovery ability of each region of the porous member 25 is set in accordance with the movement conditions of the substrate P.

Specifically, the first areas 25A of the porous member 25 are disposed lateral to the optical path space K of the exposure light EL in the Y axial directions (one on each side), and the second areas 25B are disposed lateral to the optical path space K of the exposure light EL in the X axial directions (one on each side), which intersect the Y axial directions. In addition, the second recovery ability of the second areas 25B is higher than the first recovery ability of the first areas 25A. In the present embodiment as well, holes that have the first size D1 are formed in the first areas 25A, and holes that have the second size D2, which is larger than the first size D1, are formed in the second areas 25B. Namely, the first areas 25A, which have a low recovery ability, are disposed to the sides of the optical path space K (the land surfaces) of the exposure light EL that are in the directions that are parallel to the travel direction of the substrate P, and the second areas 25B, which have a high recovery ability, are disposed to the sides of the optical path space K (the land surfaces) of the exposure light EL that are in the directions that intersect the travel direction of the substrate P. The first areas 25A are provided on the opposite sides of the optical path space K (the land surfaces 77, 77') of the exposure light EL that are in the Y axial directions, and the second areas 25B are provided on the opposite sides of the optical path space K (the land surfaces 77, 77') of the exposure light EL that are in the X axial directions. In addition, parts of the second areas 25B are disposed at the opposite sides of the first areas 25A that are in the Y axial directions.

In addition, similar to the second embodiment, the first areas 25A are formed in shapes (trapezoids) that gradually widen in the X directions as the distance from the optical path space K of the exposure light EL increases in the Y axial directions. The second areas 25B are formed in shapes (trapezoids) that gradually widen in the Y directions as the distance from the optical path space K of the exposure light EL increases in the X axial directions.

In addition, in the present embodiment, a lower surface 26A of each of the first areas 25A is spaced further apart from the front surface of the substrate P than a lower surface 26B of each of the second areas 25B is when the nozzle member 70 and the front surface of the substrate P are opposed to one another. In addition, the lower sits 26B of the second areas 25B are substantially parallel to the front surface of the substrate P, and the lower surface 26A of the first areas 25A are inclined with respect to the lower surfaces 26B of the second areas 25B.

In the present embodiment; the lower surfaces 26A of the first areas 25A am provided continuously to the second land surfaces 7T. Namely, the second land surface 77' and the lower surface 26A of the first area 25A that are provided on the +Y side of the optical path space K are inclined at substantially the same angle with respect to the land surface 77 and are flush with one another. Similarly, the second land surface 7T and the lower surface 26A of the first area 25A that are provided on the −Y side of the optical path space K are inclined at substantially the same angle with respect to the land surface 77, and are flush with one another.

Figure 19A:
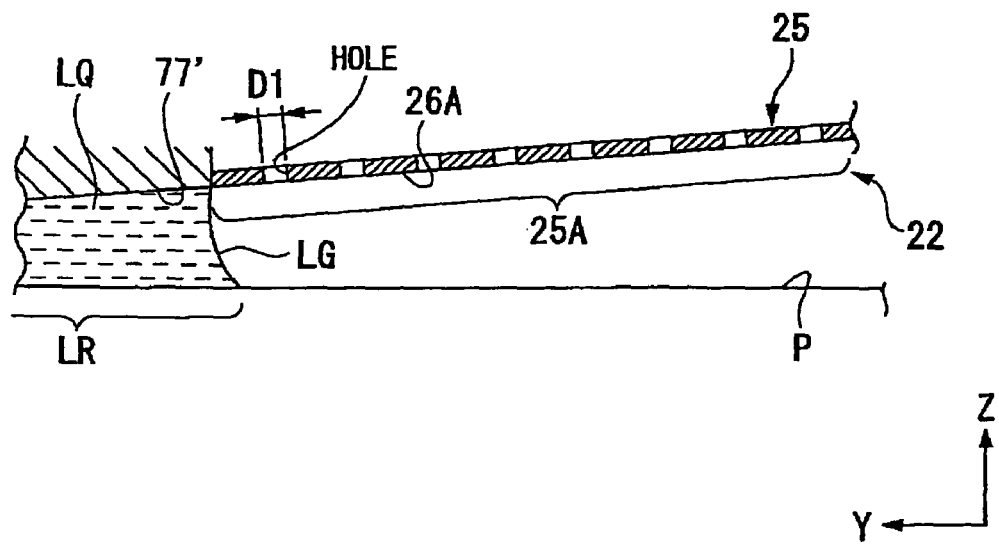
FIG. 19A is a schematic drawing that shows one example of the behavior of the liquid according to the third embodiment.
Figure 19B:
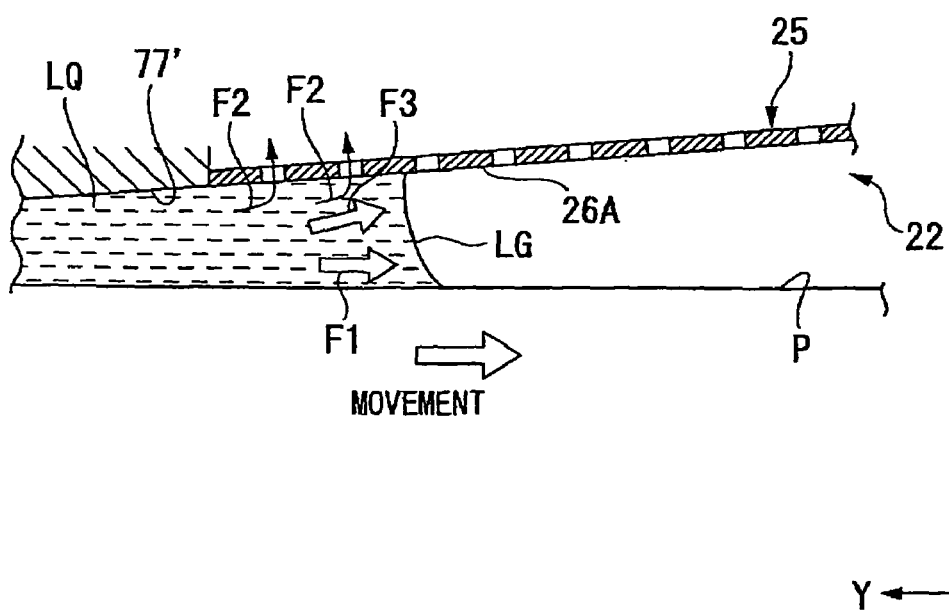
FIG. 19B is a schematic drawing that shows one example of the behavior of the liquid according to the third embodiment.

FIG. 19A and FIG. 19B are schematic drawings for explaining the behavior of the liquid LQ when the substrate P is moved in the Y axial directions. The first areas 25A of the porous member 25 are disposed in the Y axial directions with respect to the second land surfaces 77'. Starting from the first state wherein the liquid LQ is held between the front surface of the substrate P on one side and the second land surfaces 77' and the land surface 77 (see FIG. 17) on the other side as shown in FIG. 19A, if the substrate P is moved in the −Y direction by just the prescribed distance at the prescribed speed with respect to the optical path space K, and the liquid LQ thus transitions to the second state, as shown in FIG. 19B, during which the substrate P is in motion, then the liquid LQ that contacts the lower surfaces 26A is recovered via the holes of the porous member 25.

In the present embodiment, the distance between the front surface of the substrate P and the second land surfaces 77' and the distance between the front surface of the substrate P and the lower surfaces 26A of the first areas 25A are greater than the distance between the front surface of the substrate P and the land surface 77; furthermore, the space between the front surface of the substrate P on one side and the second land surfaces 77' and the lower surfaces 26A on the other side is larger than the space between the front surface of the substrate P and the land surf 77. Consequently, in the second state during which the substrate P is in motion as shown in FIG. 19B, the flow component F2, which is generated by the recovery operation of the recovery port 22, that flows towards the holes of the porous member 25 is generated in the liquid LQ of the immersion area LR along with the flow component F1 of the liquid LQ that flows in the forward travel direction (the −Y direction) of the substrate P and a flow component F3 that moves diagonally upward along the lower surfaces 26A of the f areas 25A of the porous member 25. Accordingly, when the substrate P is moved, the distance between the interface LG in the first state shown in FIG. 19A and the interface LG in the second state, during which the substrate P is in motion as shown in FIG. 19B, can be relatively reduced. Consequently, it is possible to prevent an expansion (enlargement) of the immersion area LR.

In the present embodiment as well the recovery ability of the first areas 25A of the porous member 25, which are disposed in directions that are parallel to the travel direction of the substrate P at positions that adjoin the second land surfaces 77' that do not have any recovery ability; is lowered, which makes it possible to prevent sudden changes in the behavior of the liquid LQ even when an exposure is performed while moving the substrate P.

The substrate P (the substrate stage 4) moves not only in the Y axial directions, but frequently moves also in the X axial directions, e.g., when the substage P is stepped, and therefore providing the second areas 25B, which have a high recovery ability, in the X axial directions with rest to the optical path space K of the exposure light EL makes it possible to recover the liquid LQ satisfactorily via the second areas 25B. The lower surface 26B of the second areas 25B of the porous member 25 are provided substantially parallel to the front surface (the XY plane) of the substrate P. The lower surface 26B of the second areas 25B of the porous member 25 and the land surface 77 are substantially flush with one another, and the lower f 26B of the second areas 25B of the porous member 25 that have a high recovery ability are disposed at a position that is near the substrate P. Accordingly, the immersion system 1 can satisfactorily recover the liquid LQ via the second areas 25B of the porous member 25.

Furthermore, in the third embodiment as well, the sizes of the holes of the first areas 25A and the second areas 25B are made different so as to make the recovery abilities of the first areas 25A and the second areas 25B different; however, the densities of the holes of the first areas 25A and the second areas 25B, or the thicknesses of the base material of the porous member 25 in the first areas 25A and the second areas 25B may be made different.

Furthermore, in the second and third embodiments discussed above, the recovery ability of each region of the porous member 25 differs in accordance with the travel direction of the substrate P, but it may be set in accordance with, for example, the movement speed of the substrate P, the acceleration (the deceleration) of the substrate P, and the distance of travel when the substrate P is moved linearly in one prescribed direction. For example, if the substrate P is moved at high speed, then the recovery abilities (hole sizes, densities, and the like) of the first and second areas 25A, 25B can be optimized in accordance with the movement speed of the substrate P. The movement conditions of the substrate P—including the movement speed, the acceleration (the deceleration), and the travel direction of the substrate P when the substrate P is exposed, as well as the distance of travel when the substrate P is moved in one prescribed direction—are substantially known in advance, and therefore the positional relationships (arrangements) of the regions (areas) that have dirt recovery abilities and/or the recovery abilities of each region can be optimized by taking the movement conditions (at least one of the movement speed, the acceleration (deceleration), the travel direction, and the distance of travel) of that substrate P into consideration. In addition, for example, the sizes of each of the first and second areas 25A, 25B may be optimized in accordance with the movement conditions of the substrate P.

In addition, in the third embodiment the inclination angles of the lower surfaces 26A of the first areas 25A and the second land surfaces 77' may be set in accordance with the movement conditions of the substrate P.

Fourth Embodiment

In the first through third embodiments discussed above, the recovery abilities are made different by the structures of each region of the porous member 25, e.g., the sizes and the densities of the holes of the porous member 25 as well as the thicknesses of the base material 28, different; however, it is possible make the recovery abilities of the regions of the porous member 25 different by making the suction forces that are applied by the liquid recovery apparatus 21 different. This will now be explained referencing FIG. 20.

Figure 20:
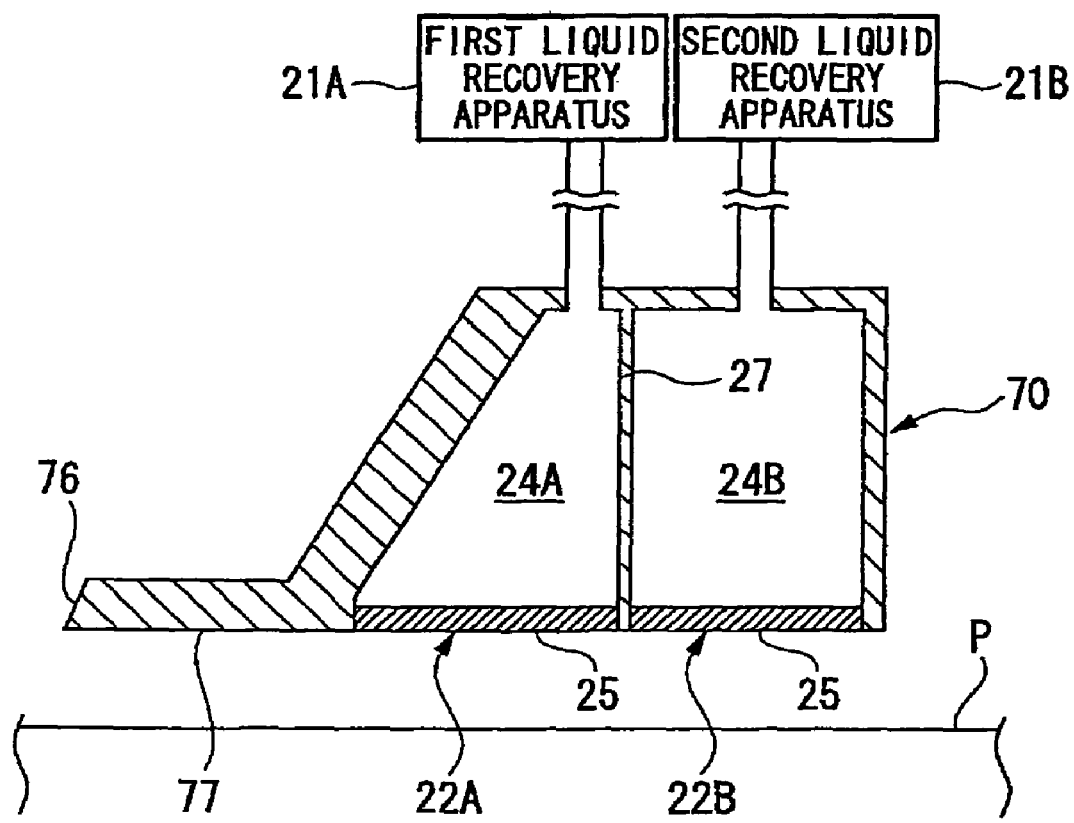
FIG. 20 is a schematic drawing that shows one example of an immersion system according to a fourth embodiment.

In FIG. 20, the nozzle member 70 comprises a first recovery port 22A and a second recovery port 22B. The fit recovery port 22A is provided in the lower surface of the nozzle member 70 at a position that is close to the optical path space K (the land surface 77) of the exposure light EL, and the second recovery port 22B is provided at a position that is further from the optical path space K of the exposure light EL than the first recovery port 22A is. In addition, two porous members 25 are provided such that there is one in each of the recovery ports 22A, 22B. In addition, a first recovery passageway 24A, which connects to the first recovery port 22A, and a second recovery passageway 24B, which connects to the second recovery port 22B, are provided inside the nozzle member 70. A partition 27 is formed between the first recovery passageway 24A and the sec recovery passageway 24B, which are independent of one another.

A first liquid recovery apparatus 21A, which suctions with a first suction force, is connected to the first recovery passageway 24A, and a second liquid recovery apparatus 21B, which suctions with a second suction force that is stronger than the first suction force, is connected to the second recovery passageway 24B. The control apparatus 7 controls the first and second liquid recovery apparatus 21A, 21B so as to make the first and second suction forces different, thereby making it possible to make the recovery abilities at the first and second recovery ports 22A, 22B different. Namely, it is possible to make the recovery abilities at the first and second recovery ports 22A, 22B different by making the pressure differential between the upper surface and the lower surface of the porous member 25 at the first recovery port 22A different than that of the porous member 25 at the second recovery port 22B. More specifically, it is possible to make the recovery abilities at the first and second recovery ports 22A, 22B different by making the pressure (negative pressure) of the first recovery passageway 24A different than that of the second recovery passageway 24B. In this case, the structure of the porous member 25 that is disposed in the first recovery port 22A may be the same as the structure of the porous member 25 that is disposed in the second recovery port 22B, or it may be different.

Furthermore, in FIG. 20, the nozzle member 70, which is similar to the nozzle member 70 in the first embodiment, is used to connect the first liquid recovery apparatus 21A, which suctions with the first suction force, to the first recovery port 22A, which is close to the optical path space K of the exposure light EL, and to connect the second liquid recovery apparatus 21B, which suctions with the second suction force, to the second recovery port 22B, which is provided at a position that is further from the optical path space K of the exposure light EL than the first recovery port 22A is; however, a nozzle member that is similar to that of, or example, the second and third embodiments may be used to dispose two first recovery ports 22A, which are c to the first liquid recovery apparatus 21A that suctions with the first suction force, in the Y axial directions with respect to the optical path space K of the exposure light EL, and to dispose two second recovery ports 22B, which are connected to the second liquid recovery apparatus 21B that suctions with the first suction force, in the X axial directions with respect to the optical path space K of the exposure light EL.

In addition, in the second, the third, and the fourth embodiments as well, the recovery port(S) 22 (the porous member(S) 25) can be modified into three or more separate areas that have different recovery abilities, and the recovery abilities of the regions of the recovery port(S) 22 (the porous member(S) 25) may be varied continuously.

Furthermore, in the first through fourth embodiments discussed above, the first areas 25A and the second areas 25B may be provided in a single member, and the porous member that has the first areas 25A may be different than the porous member that has the second areas 25B.

In addition, in the first through fourth embodiments discussed above, a configuration may be adopted wherein the recovery abilities of the regions of the recovery port 22 (the porous member 25) are variable (adjustable). For example, the sizes of the holes of the porous member 25 may be provided so that they are variable. For example, the sizes of the holes of the porous member 25 may be varied in accordance with the movement conditions of the she P. The following explains one example of a method of the sizes of the holes of the porous member 25 that is disposed in the recovery port 22, referring FIG. 21A and FIG. 21B.

Figure 21A:
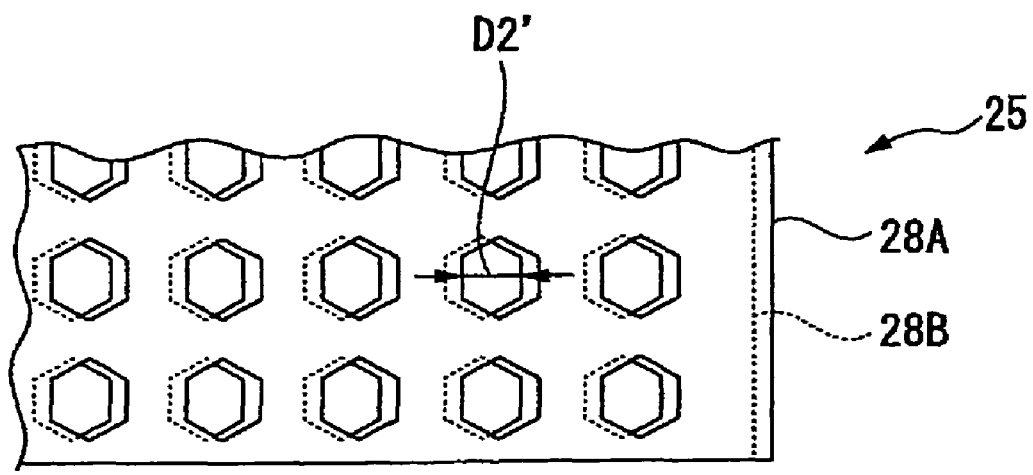
FIG. 21A is a schematic drawing that shows one example of the porous member.
Figure 21B:
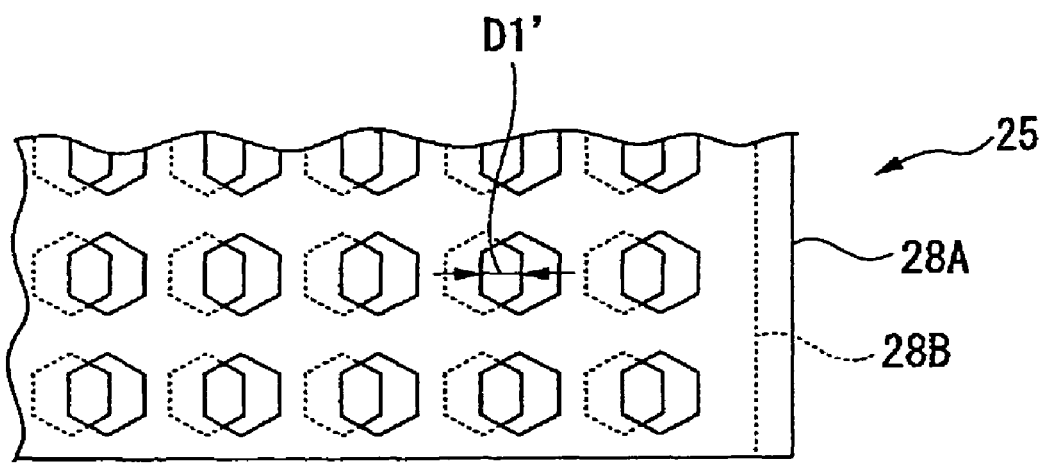
FIG. 21B is a schematic drawing that shows one example of the porous member.

In FIG. 21A, the porous member 25 comprises plate shaped first and second base materials 28A, 28B, each of which has a plurality of holes formed therein. In the present embodiment, a plurality of hexagonal holes is formed in each of the first and second base materials 28A, 28B. The positional relationship between the first and second base materials 28A, 28B is adjusted by a prescribed drive apparatus. For example, as shown in FIG. 21B, the sizes of the holes of the porous member 25 can be adjusted by adjusting the positional relationship (the degree of overlap) of the holes that are formed in the first base material 28A and the holes that are formed in the second base material 28B. With the positional relationship of the first and second base materials 28A, 28B shown in FIG. 21A, holes of a size D2' are formed as the holes of the porous member 25; in addition, with the positional relationship of the first and second base materials 28A, 28B shown in FIG. 21B, holes of a size D1' are formed as the holes of the porous member 25.

Furthermore, the above explained a case wherein there are two base materials with holes, but of course it is possible to provide an arbitrary number of three or more base materials. In addition, the density of the holes of the porous member 25, the thickness of the porous member 25, and the shapes of the holes of the porous member 25 may be adjusted by properly adjusting the positional relationship between the base materials.

In addition, the recovery abilities of just some regions of the plurality of regions of the recovery port 22 (the porous member 25) may be varied.

In addition, if a configuration is adopted wherein the recovery ability of each region of the recovery port 22 (the porous member 25) is variable (adjustable), then, for example, before starting the exposure of the substrate P, the recovery ability of each region of the recovery port 22 (the porous member 25) may be adjusted based on exposure conditions (the movement conditions of the substrate P, the contact angle of the liquid LQ with respect to the front sure of the substrate P, and the like) of that substrate P, and may be varied dynamically in accordance with the movement (the travel direction, the movement speed, and the like) of the substrate P, for example, during the exposure of the subs P.

Furthermore, in each of the embodiments discussed above, the porous member 25 that recovers the liquid LQ is disposed at a position at which it opposes the front surface of the substrate P; however, for example, if a recovery port that recovers the liquid LQ is provided to the upper surface 4F of the substrate stage 4 and the like, then the recovery abilities of the regions of that recovery port may be made different. In this case, a porous member of the type explained in the embodiments discussed above may be disposed in that recovery port.

Furthermore, the method of making the recovery abilities of the regions of the recovery port different is of course not limited to the methods discussed above; moreover, the methods discussed above may be appropriately combined. Namely, it is possible to make the recovery forces of the regions of the recovery port different by making at least one of the abovementioned diameters, densities, and shapes of the holes of the porous member, the thicknesses of the porous member, and the pressures (suction forces) in the recovery passageways that pass through the porous member different.

Furthermore, in each of the embodiments discussed above, the porous member 25 is disposed in the recovery port 22, but it does not have to be. For example, the porous member 25 may be disposed in just some of the regions of the recovery port 22.

Furthermore, each of the embodiments discussed above explained a case we the optical path space K is filled with the liquid LQ in the state wherein the substrate P is disposed at a position at which it can be irradiate by the exposure light EL, i.e., in the state wherein the projection optical system PL and the substrate P are opposed to one another, however, the same applies to the case wherein the optical path space K is filled with the liquid LQ in the state wherein an object other than the substrate P (e.g., the upper surface 4F of the substrate stage 4) is opposed to the projection optical system PL. Here, the position at which the object can be irradiated by the exposure light EL includes the position at which it opposes the projection optical system PL.

In addition, it is also possible to configure the immersion system 1 such that the sizes of the holes of the porous member 25 and the like are optimized so that gas is not recovered via the recovery port 22, as disclosed in PCT International Publication WO2005/024517.

Furthermore, the projection optical system PL of the embodiments discussed above fills the liquid LQ in the optical path space K on the image plane side of the last optical element FL, but it is also possible to employ a projection optical system that fills the liquid in the optical path space on the object surface side of the last optical element, as disclosed in PCT International Publication WO2004/019128.

Furthermore, although the liquid LQ in the present embodiment is water, it may be a liquid other than water; for example, if the light source of the exposure light EL is an $F_2$ laser, the light of which does not transmit through water, then it is acceptable to use a fluorine based fluid that is capable of transmitting $F_2$ laser light, such as perfluorinated polyether (PFPE) or fluorine based oil, as the liquid LQ. In this case, the parts that contact the liquid LQ are lyophilically treated by forming a thin film with, for example, a substance that has a molecular structure that contains fluorine or the like and has low polarity. In addition, it is also possible to use, as the liquid LQ, a liquid (e.g., cedar oil) that is transparent to the exposure light EL, has the highest possible refractive ink and is stable with respect to the projection optical system PL and the photoresist that is coated on the front surface of the substrate P.

In addition, a liquid that has a refractive index of approximately 1.6 to 1.8 may be used as the liquid LQ. Examples of liquids that can be used as the liquid LQ include: a prescribed liquid that has an O—H bond or a C—H bond such as isopropanol, which has a refractive index of approximately 1.50, or glycerol (glycerin), which has a refractive index of approximately 1.61; a prescribed liquid (organic solvent) such as hexane, heptane, or decane; and a prescribed liquid such as decalin or bicyclohexyl. Alternatively, two or more arbitrary types of these prescribed liquids may be mixed together, or an abovementioned prescribed liquid may be added to (mixed with) pure water. Alternatively, the liquid LQ may be a liquid wherein a base, such as $H^+$, $Cs^+$, $K^+$, $Cl^-$, $SO_4^{2-}$, $PO_4^{2-}$, or an acid is added to (mixed with) pure water. Furthermore, the liquid LQ may be a liquid wherein fine particles of aluminum oxide or the like are added to (mixed with) pure wall. These liquids can transmit ArF excimer laser light. In addition, the liquid LQ preferably has a small light absorption coefficient, low temperature dependency, and is stable with respect to the photosensitive material (a protective film such as a topcoat film; an antireflection film; or the like) that is coated on the projection optical system PL and/or the front surface of the substrate P.

The optical element FL can be formed from, for example, quartz (silica). Alternatively, it may be formed from a monocrystalline fluorine compound material such as calcium fluoride (fluorite), barium fluoride, strontium fluoride, lithium fluoride, sodium fluoride, and $BaLiF_3$. Furthermore, the last optical element FL may be firmed from lutetium aluminum garnet (LuAG).

At least one of the optical element of the projection optical system PL may be formed from a material that has a refractive index that is higher than that of quartz and/or fluorite (e.g., 1.6 or greater). For example, it is possible to use sapphire, grum dioxide, or the like as, disclosed in PCT International Publication WO2005/059617, or potassium chloride (which has a refractive index of approximately 1.75) or the like as disclosed in PCT International Publication WO2005/059618.

Nevermore, the substrate P in each of the abovementioned embodiments is not limited to a semiconductor wafer for fabricating semiconductor devices; for example, a glass substrate for a display device, a ceramic wafer for a thin film magnetic head, or the original plate of a mask or a reticle (sync quartz, silicon wafer) that is used by an exposure apparatus can be employed as the substrate P. The substrate P is not limited to a circle, and may be another shape, e.g., a rectangle.

The exposure apparatus EX can also be adapted to a step-and-scan type scanning exposure apparatus (a scanning stepper) that scans and exposes the pattern of the mask M by synchronously moving the mask M and the substrate P, as well as to a step-and-repeat type projection exposure apparatus (a stepper) that performs full field exposure of the pattern of the mask M with the mask M and the substrate P in a stationary state, and sequentially steps the substrate P.

In addition, the exposure apparatus EX can also be adapted to an exposure apparatus that uses a projection optical system (e.g., a dioptric projection optical system, which does not include a reflecting element, that has a ⅛ reduction magnification) to expose the substrate P with the full field of a reduced image of a first pattern in a state wherein the first pattern and the substrate P are substantially stationary. In this case, the exposure apparatus EX can also be adapted to a stitching type full field exposure apparatus that subsequently further uses that projection optical system to expose the substrate P with the full field of a image of a second pattern, a state wherein the second pattern and the substrate P are substantially stationary, so that the second pattern partially overlaps the first pattern. In addition the stitching type exposure apparatus can also be adapted to a step-and-stitch type exposure apparatus that transfers at least two patterns to the substrate P so that they are partially superposed, and sequentially steps the substrate P.

In addition, the present invention can also be adapted to a twin stage type exposure apparatus that is provided with a plurality of substrate stage, as disclosed in Japanese Patent Application Publication No. H10-163099A, Japanese Patent Application Publication No. H10-214783A, Published Japanese Translation No. 2000-505958 of the PCT International Publication, U.S. Pat. No. 6,341,007, U.S. Pat. No. 6,400,441, U.S. Pat. No. 6,549,269, and U.S. Pat. No. 6,590,634.

Furthermore, the present invention can also be adapted to an exposure apparatus that is provided with a substrate stage that holds the substrate and a measurement stage whereon a fiducial member (wherein a fiducial mark is formed) and various photoelectric sensors are mounted, as disclosed in Japanese Patent Application Publication No. H11-135400A, Japanese Patent Application Publication No. 2000-164504, and U.S. Pat. No. 6,897,963.

In the exposure apparatus of each of the abovementioned embodiments, the mask M is disposed above (on the +Z side of) the projection optical system PL and the substrate P is disposed therebelow (on the −Z side); however, a projection optical system (plurality of projection modules) may be provided so that it is flipped upside down vertically (in a Z axial direction), the substrate may be disposed above (on the +Z side) of the projection optical system, and the mask may be disposed therebelow (on the −Z side), as disclosed in, for example, PCT International Publication WO2004/090956 (corresponding U.S. Patent Application No. 2006/0023188A1).

In each of the abovementioned embodiments, positional information about the mask stage 3 and the subs stage 4 is measured using an interferometer system, but the present invention is not limited thereto and, for example, an encoder system may be used that detects a scale (diffraction grating) that is provided to the upper surface of the substrate stage. Ea this case, it is preferable to adopt a hybrid system that is provided with both an interferometer system and an encoder system, and to use the measurement results of the interferometer system to calibrate the measurement results of the encoder system. In addition, the position of the substrate stage may be controlled by switching between the interferometer system and the encoder system, or by using both.

Each of the abovementioned embodiments explained an exemplary case wherein the exposure apparatus EX is provided with the projection optical system PL, but the present invention can be adapted to an exposure apparatus and an exposing method that do not use the projection optical system. Even if a projection optical system is not used, exposure light is radiated onto the substrate through an optical member, such as a mask or a lens, and an immersion region is formed in a prescribed space between the substrate and such an optical member.

The type of exposure apparatus EX is not limited to a semiconductor device fabrication exposure apparatus that exposes the pattern of a semiconductor device on the substrate P, but can also be widely adapted to exposure apparatuses that are used for fabricating, for example, liquid crystal devices or displays, and exposure apparatuses that are used for fabricating thin film magnetic heads, image capturing devices (CCDs), micromachines, MEMS, DNA chips, or reticles and masks.

Furthermore, in the embodiments discussed above, a light transmitting type mask is used wherein a prescribed shielding pattern (or a phase pattern or a dimming pattern) is formed on a light transmitting substrate, however, instead of such a mask, it is also possible to use an electronic mask wherein a transmittance patter, a reflected pattern, or a light emitting pattern is formed based on electric data of the pattern to be exposed, as disclosed in, for example, U.S. Pat. No. 6,778,257; here, an electronic mask, which is also called a variable forming mask, includes, for example, a digital micromirror device (DMDs), which is one type of a non light emitting image display device (a spatial light modulator).

In addition, by forming interference fringes on the substrate P as disclosed in, for example, PET International Publication WO2001/035168, the present invention can also be adapted to an exposure apparatus (a lithographic system) that exposes the substrate P with a line-and-space patty.

Furthermore, the present invention can also be adapted to an exposure apparatus that combines, through a projection optical system, the patens of two masks on a substrate, and double exposes, substantially simultaneously, a single shot region on that substrate with a single scanning exposure, as disclosed in, for example, Published Japanese Translation No. 2004-519850 of the PCT International Publication (corresponding U.S. Pat. No. 6,611,316).

As far as is permitted, the disclosures in all of the Publications and U.S. patents related to exposure apparatuses and the like cited in the above respective embodiments and modified examples, are incorporated herein by reference.

As described above, the exposure apparatus EX of each of the abovementioned embodiments is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjust to achieve mechanical accuracy for the various mechanical systems, and an adjustment to achieve electrical accuracy for the various electrical systems. The process of assembling the exposure apparatus EX from the various subs includes, for example, the mechanical interconnection of the various subsystems, the wiring and connection of electrical circuits, and the piping and connection of the atmospheric pressure circuit. Naturally, prior to performing the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EX in a clean room wherein, for example, the temperature and the cleanliness level are controlled.

Figure 22:
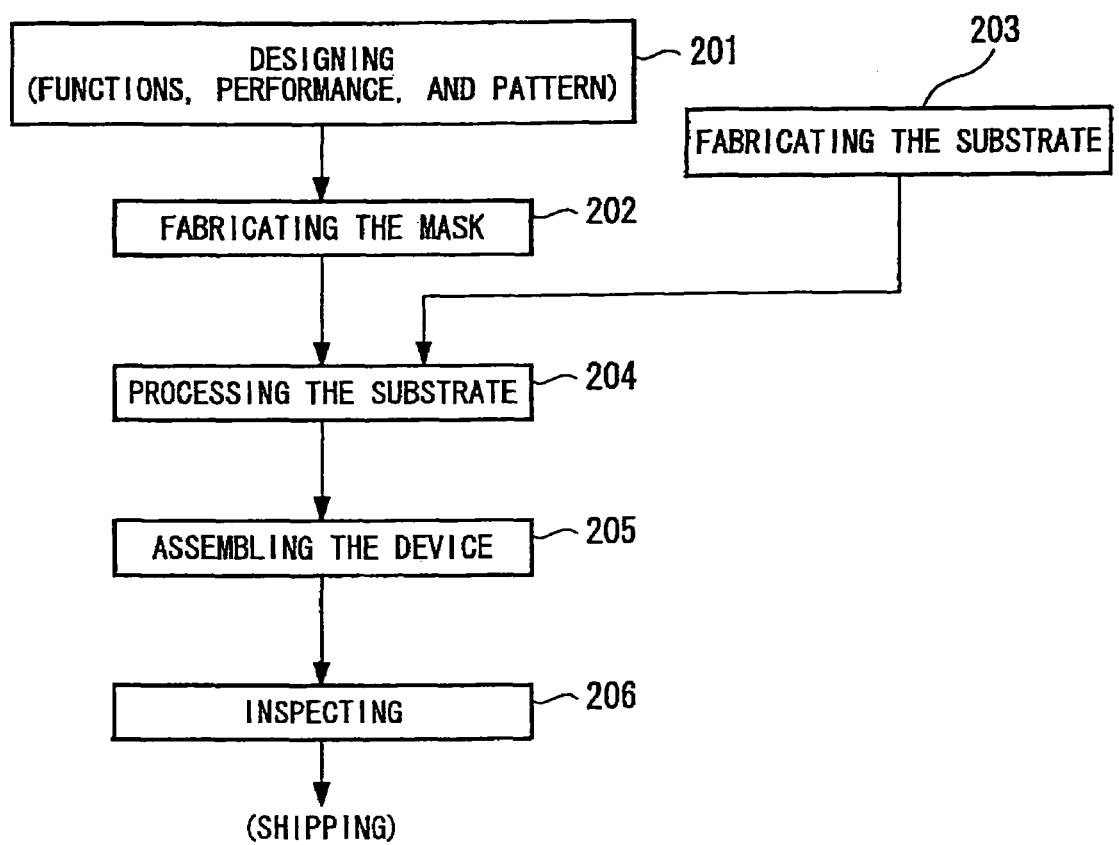
FIG. 22 is a flow chart diagram that depicts one example of a process of fabricating a microdevice.

As shown in FIG. 22, a micro-device, such as a semiconductor device, is manufactured by, for example: a step 201 that designs the functions and performance of the micro-device; a step 202 that fabricates a mask (reticle) based on this designing step; a step 203 that fabricates a substrate, which is the base material of the device; a step 204 that includes substrate treatment processes, such as the process of exposing the pattern of the mask onto the substrate by using the exposure apparatus EX of the embodiments discussed above, a process that develops the exposed substrate, and a process that heats (cures) and etches the developed substrate; a device assembling step 205 (comprising a dicing process, a bonding process, and a packaging process); and an inspecting step 206.

What is claimed is:

1. An exposure apparatus that exposes a substrate by radiating exposure light on the substrate, comprising:
   a projection optical system; and
   a recovery member that recovers a liquid;
   wherein,
   the recovery member comprises an opening through which the exposure light from the projection optical system is projected,
   the recovery member comprises a porous member having a first portion, which has a first liquid recovery ability, and a second portion, which has a second liquid recovery ability that is different than the first liquid recovery ability, that is disposed at a position that is different from a position of the first portion,
   the first portion and the second portion are each disposed such that a face of the substrate is opposite the first portion and the second portion during exposure, and
   a structure of the first portion of the porous member is different from a structure of the second portion of the porous member.

2. An exposure apparatus according to claim 1, wherein when the substrate is moved to a position at which the substrate opposes the recovery member, the recovery member can recover the liquid on the substrate in the first portion and the second portion.

3. An exposure apparatus according to claim 1, wherein the recovery member is provided at an outer side of an optical path of the exposure light.

4. An exposure apparatus according to claim 1, further comprising:
   a first surface that has an opening through which the exposure light passes;
   wherein,
   the recovery member is disposed further at an outer side of an optical path of the exposure light than the first surface is; and
   when the substrate is opposed to the first surface, the liquid can be held between the first surface and the substrate.

5. An exposure apparatus according to claim 4, wherein the recovery member comprises a second surface, which is substantially flush with the first surface.

6. An exposure apparatus according to claim 5, wherein when a front surface of the substrate is opposed to the first surface, the front surface of the substrate and the first surface are substantially flush.

7. An exposure apparatus according to claim 1, wherein the position of the first portion and the position of the second portion are different with respect to the optical path of the exposure light.

8. An exposure apparatus according to claim 7, wherein the first portion and the second portion are provided at different distances from the optical path of the exposure light.

9. An exposure apparatus according to claim 8, wherein the position of the second portion is disposed further from the optical path of the exposure light than the position of the first portion is; and
the second liquid recovery ability is higher than the first liquid recovery ability.

10. An exposure apparatus according to claim 9, wherein the first portion surrounds the optical path of the exposure light; and
the second portion surrounds the first portion.

11. An exposure apparatus according to claim 7, wherein the first portion is disposed at a side of the optical path of the exposure light that is in a first direction, and the second portion is disposed at a side of the optical path that is in a second direction, which is different than the first direction.

12. An exposure apparatus according to claim 1, wherein the position of the first portion, the position of the second portion, the first liquid recovery ability, and the second liquid recovery ability are each set in accordance with a movement condition of the substrate.

13. An exposure apparatus according to claim 11, wherein the substrate moves along the first direction with respect to the exposure light;
the first portion is disposed at the side of the optical path of the exposure light that is in the first direction;
the second portion is disposed at the side of the optical path of the exposure light that is in the second direction, which intersects the first direction; and
the second liquid recovery ability is higher than the first liquid recovery ability.

14. An exposure apparatus according to claim 13, wherein when the recovery member and the substrate are opposed to one another, a spacing that is between the first portion and the substrate differs from a spacing that is between the second portion and the substrate.

15. An exposure apparatus according to claim 14, wherein the spacing between the first portion and the substrate is larger than the spacing between the second portion and the substrate.

16. An exposure apparatus according to claim 14, wherein a front surface of the second portion is inclined with respect to a front surface of the first portion.

17. An exposure apparatus according to claim 16, wherein the front surface of the second portion is substantially parallel to a front surface of the substrate.

18. An exposure apparatus according to claim 1, wherein a spacing between the first portion and the substrate and a spacing between the second portion and the substrate are different.

19. An exposure apparatus according to claim 1, wherein the porous member is disposed in a recovery port, which is connected to a suction apparatus that is capable of recovering the liquid.

20. An exposure apparatus according to claim 1, wherein the first liquid recovery ability and the second liquid recovery ability are made different by making the structure of the first portion and the structure of the second portion of the porous member different.

21. An exposure apparatus according to claim 20, wherein the sizes of the holes of the first portion and the sizes of the holes of the second portion of the porous member are different.

22. An exposure apparatus according to claim 20, wherein the density of the holes of the first portion and the density of the holes of the second portion of the porous member are different.

23. An exposure apparatus according to claim 20, wherein the porous member is a plate shaped member; and
a thickness of the first portion and a thickness of the second portion of the porous member are different.

24. An exposure apparatus according to claim 1, wherein the first portion and the second portion of the recovery member are connected to a suction apparatus, which is capable of recovering the liquid; and
the first liquid recovery ability and the second liquid recovery ability are made different by making suction forces applied by the suction apparatus at the first portion and the second portion of the recovery member different.

25. An exposure apparatus according to claim 1, wherein the first liquid recovery ability, the second liquid recovery ability, or both are adjustable.

26. A device fabricating method, comprising:
exposing a substrate using an exposure apparatus according to claim 1; and
developing the exposed substrate.

27. An exposing method that exposes a substrate by radiating exposure light on the substrate, comprising:
moving the substrate to a position at which the substrate opposes a liquid recovery member comprising a porous member,
recovering a liquid on the substrate via a first portion of the porous member of the recovery member with a first recovery ability;
recovering the liquid on the substrate via a second portion of the porous member, which is disposed at a position that is different from a position of the first portion of the recovery member, with a second recovery ability, which is different than the first recovery ability; and
radiating the exposure light through an opening in the recovery member to the substrate through the liquid on the substrate, wherein
the first portion and the second portion are each disposed such that a face of the substrate is opposite the first portion and the second portion during exposure, and
a structure of the first portion of the porous member is different from a structure of the second portion of the porous member.

28. An exposing method according to claim 27, wherein a positional relationship between an optical path of the exposure light and the position of the first portion and a positional relationship between the optical path of the exposure light and the position of the second portion are different.

29. An exposing method according to claim 28, wherein the first portion and the second portion are positioned at different distances from the optical path of the exposure light.

30. An exposing method according to claim 28, wherein the first portion is disposed at a side of the optical path of the exposure light that is in a first direction; and
the second portion is disposed at a side of the optical path of the exposure light that is in a second direction, which intersects the first direction.

31. An exposing method according to claim 27, wherein the liquid on the substrate is recovered via the porous member at the first portion and the second portion.

32. An exposing method according to claim 31, wherein the structure of the porous member comprises sizes of holes.

33. An exposing method according to claim 31, wherein the structure of the porous member comprises a density of holes.

34. An exposing method according to claim 31, wherein the porous member is a plate shaped member; and the structure of the porous member comprises a thickness.

35. An exposing method according to claim 27, wherein a pressure of the liquid in a recovery passageway into which the liquid that is recovered at the first portion flows and a pressure of the liquid in the recovery passageway into which the liquid that is recovered by the second portion flows are different.

36. An exposing method according to claim 27, comprising:
adjusting the first liquid recovery ability, the second liquid recovery ability, or both.

37. A device fabricating method, comprising:
exposing a substrate using an exposing method according to claim 27; and
developing the exposed substrate.

38. A liquid recovery member that is used to recover a liquid in an immersion exposure apparatus, comprising:
an opening through which exposure light from a projection optical system is projected onto a substrate; and
a porous member having:
a first portion that has a first liquid recovery ability; and
a second portion, which has a second liquid recovery ability that is different from the first liquid recovery ability, that is disposed at a position that is different than a position of the first portion, wherein
the first portion and the second portion are each disposed such that a face of the substrate is opposite the first portion and the second portion during exposure, and
a structure of the first portion of the porous member is different from a structure of the second portion of porous member.

39. A liquid recovery member according to claim 38, wherein
the first portion and the second portion comprise a plurality of holes; and
the liquid is recovered by the plurality of holes.

40. A liquid recovery member according to claim 39, wherein
sizes of the holes of the first portion and sizes of the holes of the second portion are different.

41. A liquid recovery member according to claim 39, wherein
a density of the holes of the first portion and a density of the holes of the second portion are different.

42. A liquid recovery member according to claim 39, wherein
shapes of the holes of the first portion and shapes of the holes of the second portion are different.

43. A liquid recovery member according to claim 39, further comprising:
a plate member that is provided at the first portion and the second portion and in which the plurality of holes is formed;
wherein,
a thickness of the plate member at the first portion and a thickness of the plate member at the second portion are different.

44. A liquid recovery member according to claim 43, wherein
the plate member that is disposed at the first portion and the plate member that is disposed at the second portion are the same member.

45. A liquid recovery member according to claim 38, wherein
in the immersion exposure apparatus, a substrate to be exposed can move to a position at which the substrate opposes the first portion and the second portion, and the liquid on the substrate can be recovered via the first portion and the second portion.

* * * * *